United States Patent
Park et al.

(10) Patent No.: US 11,508,443 B2
(45) Date of Patent: Nov. 22, 2022

(54) NONVOLATILE MEMORY DEVICE INCLUDING A PERIPHERAL CIRCUIT TO VERIFY A PROGRAM OPERATION

(71) Applicant: SAMSUNG ELECTRONICS CO., LTD., Suwon-si (KR)

(72) Inventors: Gyu-Ha Park, Hwaseong-si (KR); Hyungsuk Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 17/004,074

(22) Filed: Aug. 27, 2020

(65) Prior Publication Data

US 2021/0225450 A1 Jul. 22, 2021

(30) Foreign Application Priority Data

Jan. 16, 2020 (KR) .................. 10-2020-0005877

(51) Int. Cl.
| | | |
|---|---|---|
| *G11C 16/26* | (2006.01) | |
| *G11C 16/16* | (2006.01) | |
| *G11C 16/34* | (2006.01) | |
| *G11C 16/24* | (2006.01) | |
| *G11C 16/08* | (2006.01) | |

(52) U.S. Cl.
CPC .............. *G11C 16/16* (2013.01); *G11C 16/08* (2013.01); *G11C 16/24* (2013.01); *G11C 16/26* (2013.01); *G11C 16/3459* (2013.01)

(58) Field of Classification Search
CPC .................. G11C 16/0483; G11C 16/3459
See application file for complete search history.

(56) References Cited

U.S. PATENT DOCUMENTS

| | | | |
|---|---|---|---|
| 7,679,133 | B2 | 3/2010 | Son et al. |
| 7,692,970 | B2 | 4/2010 | Park et al. |
| 7,715,238 | B2 | 5/2010 | Lee et al. |
| 7,995,393 | B2 | 8/2011 | Kim et al. |
| 8,305,804 | B2 | 11/2012 | Kim et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,661,294 | B2 | 2/2014 | Lee et al. |
| 9,842,659 | B2 | 12/2017 | Nam et al. |

(Continued)

FOREIGN PATENT DOCUMENTS

| | | |
|---|---|---|
| KR | 10-0851853 | 8/2008 |
| KR | 10-2015-0116351 | 10/2015 |

*Primary Examiner* — Alfredo Bermudez Lozada
(74) *Attorney, Agent, or Firm* — F. Chau & Associates, LLC

(57) ABSTRACT

A nonvolatile memory device includes a memory cell array including a plurality of memory cells, and a peripheral circuit that performs a program operation of repeatedly performing a program loop. The program loop includes performing a program by applying a program voltage to memory cells selected from the plurality of memory cells, and a first verify by applying a plurality of verify voltages to the selected memory cells. The peripheral circuit completes the program operation in response to a success of the first verify, performs a second verify by applying an additional verify voltage different from the plurality of verify voltages to the selected memory cells, and determines the program operation has failed in response to a failure of the second verify.

11 Claims, 19 Drawing Sheets

(56) References Cited

U.S. PATENT DOCUMENTS

| | | |
|---|---|---|
| 10,061,633 B2 | 8/2018 | Yim et al. |
| 10,338,848 B2 | 7/2019 | Kim |
| 2010/0172185 A1* | 7/2010 | Kim ................... G11C 16/3454 365/185.22 |
| 2011/0233648 A1 | 9/2011 | Seol et al. |
| 2018/0113620 A1 | 4/2018 | Kwon et al. |
| 2019/0051362 A1 | 2/2019 | Lee |

* cited by examiner

NONVOLATILE MEMORY DEVICE INCLUDING A PERIPHERAL CIRCUIT TO VERIFY A PROGRAM OPERATION

CROSS-REFERENCE TO RELATED APPLICATIONS

This U.S. non-provisional patent application claims priority under 35 U.S.C. § 119 to Korean Patent Application No. 10-2020-0005877 filed on Jan. 16, 2020, in the Korean Intellectual Property Office, the disclosure of which is incorporated by reference in its entirety herein.

BACKGROUND

1. Technical Field

Embodiments of the inventive concept disclosed herein relate to a semiconductor memory, and more particularly, relate to a nonvolatile memory device and a storage device including the nonvolatile memory device.

2. Discussion of Related Art

A storage device may include a nonvolatile memory. A nonvolatile memory is a type of memory that can retrieve stored information even after power is no longer supplied to the storage device. Examples of nonvolatile memory include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

The degree of integration and a volume of the storage device continue to increase as semiconductor manufacturing technologies develop. The high degree of integration of the storage device makes it possible to reduce manufacturing costs of the storage device. However, the high degree of integration of the storage device causes scale-down and a structure change of the storage device. Memory cells may be stacked on top of one another to improve integration. The stacked structure may cause an increase in height of vias connected with word line lines, which may increase the chance of a manufacturing defect occurring in a word line. The manufacturing detect may result in variation in the resistances of the word lines. Thus, it may be difficult to normally read data stored in the memory cells in a read operation.

SUMMARY

At least one embodiment of the inventive concept provides a nonvolatile memory device for detecting and processing an abnormal distribution in a program operation and a storage device including the nonvolatile memory device.

According to an exemplary embodiment of the inventive concept, a nonvolatile memory device includes a memory cell array including a plurality of memory cells, and a peripheral circuit that performs a program operation of repeatedly performing a program loop, wherein the program loop includes performing a program by applying a program voltage to memory cells selected from the plurality of memory cells, and performing a first verify by applying a plurality of verify voltages to the selected memory cells. The peripheral circuit completes the program operation in response to a success of the first verify, performs a second verify by applying an additional verify voltage different from the plurality of verify voltages to the selected memory cells, and determines the program operation has failed in response to a failure of the second verify.

According to an exemplary embodiment of the inventive concept, a nonvolatile memory device includes a row decoder block that applies a program voltage to a selected word line connected with memory cells selected from a plurality of memory cells during a program of a program operation and applies a plurality of verify voltages to the selected word line during a first verify of the program operation, a page buffer block that applies first bias voltages to bit lines connected with the selected memory cells in the program, wherein, during the first verify, the page buffer block stores first sensing bits respectively corresponding to the bit lines by sensing first voltages of the bit lines after applying second bias voltages to the bit lines, a counter block that generates a first count value by counting a number of first sensing bits having a first value from among the first sensing bits, during the 1-stage verify, and a control logic block that determines one of a pass and a fail of the first verify depending on the first count value. After a pass corresponding to a target verify voltage among the plurality of verify voltages is determined during the first verify, the row decoder block applies an additional verify voltage different from the plurality of verify voltages to the selected word line, during a second verify of the program operation. The page buffer block stores second sensing bits respectively corresponding to the bit lines by sensing second voltages of the bit lines after applying third bias voltages to the bit lines, during the second verify. The counter block generates a second count value by counting a number of second sensing bits having a second value from among the second sensing bits, during the second verify. The control logic block determines one of a pass and a fail of the second verify depending on the second count value.

According to an exemplary embodiment of the inventive concept, a storage device includes a nonvolatile memory device, and a controller that transmits a write command, an address, and data to the nonvolatile memory device. The nonvolatile memory device includes a memory cell array including a plurality of memory cells, a peripheral circuit that performs a program operation of repeatedly performing a program loop in response to the write command, wherein the program loop includes performing a program by applying a program voltage to memory cells, which are connected with a word line selected by the address, from among the plurality of memory cells, and performing a first verify to apply a plurality of verify voltages. The peripheral circuit completes the program operation in response to a success of the first verify based on the data, performs a second verify to apply an additional verify voltage different from the plurality of verify voltages to the memory cells connected with the selected word line, and determines the program operation has failed in response to a failure of the 2-stage verify.

BRIEF DESCRIPTION OF THE DRAWINGS

The inventive concept will become apparent by describing in detail exemplary embodiments thereof with reference to the accompanying drawings.

DETAILED DESCRIPTION OF THE EXEMPLARY EMBODIMENTS

Figure 1:
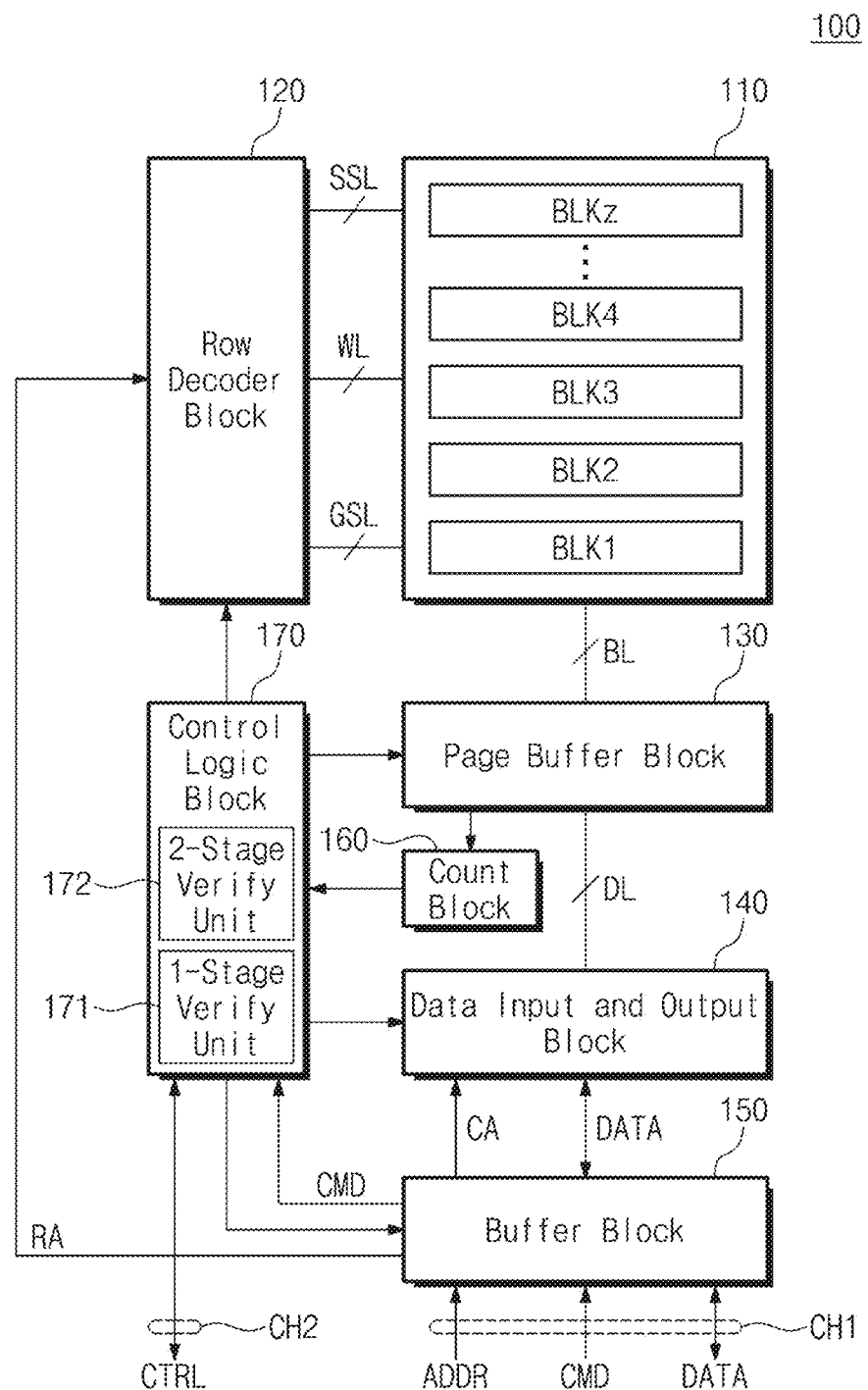
FIG. 1 is a block diagram illustrating a nonvolatile memory device according to an exemplary embodiment of the inventive concept.

The inventive concept will now be described more fully with reference to the accompanying drawings, in which exemplary embodiments thereof are shown Like reference numerals in the drawings denote like elements, and thus their description will be omitted.

FIG. 1 is a block diagram illustrating a nonvolatile memory device 100 according to an exemplary embodiment of the inventive concept. Referring to FIG. 1, the nonvolatile memory device 100 includes a memory cell array 110, a row decoder block 120 (e.g., a row decoder circuit), a page buffer block 130, a data input and output block 140 (e.g., a data input/output circuit), a buffer block 150, a count block 160 (e.g., a counter circuit), and a control logic block 170 (e.g., a control circuit).

The memory cell array 110 includes a plurality of memory blocks BLK1 to BLKz. Each of the memory blocks BLK1 to BLKz may include a plurality of memory cells. Each of the memory blocks BLK1 to BLKz may be connected with the row decoder block 120 through one or more ground selection lines GSL, word lines WL, and one or more string selection lines SSL. Some of the word lines WL may be used as dummy word lines. Each of the memory blocks BLK1 to BLKz may be connected with the page buffer block 130 through a plurality of bit lines BL. The plurality of memory blocks BLK1 to BLKz may be connected in common with the plurality of bit lines BL.

In an exemplary embodiment, each of the plurality of memory blocks BLK1 to BLKz is a unit of an erase operation. The memory cells belonging to each of the memory blocks BLK1 to BLKz may be erased at the same time. In another example, each of the plurality of memory blocks BLK1 to BLKz may be divided into a plurality of sub-blocks. Each of the plurality of sub-blocks may correspond to a unit of an erase operation.

The row decoder block 120 is connected with the memory cell array 110 through the ground selection lines GSL, the word lines WL, and the string selection lines SSL. The row decoder block 120 operates under control of the control logic block 170.

The row decoder block 120 may decode a row address RA received from the buffer block 150 and may control voltages to be applied to the string selection lines SSL, the word lines WL, and the ground selection lines GSL based on a result of decoding the row address RA.

The page buffer block 130 is connected with the memory cell array 110 through the plurality of bit lines BL. The page buffer block 130 is connected with the data input and output block 140 through a plurality of data lines DL. The page buffer block 130 operates under control of the control logic block 170.

In a write operation, the page buffer block 130 may store data to be written in memory cells. The page buffer block 130 may apply voltages to the plurality of bit lines BL based on the stored data. In a read operation or in a verify read (or verify) operation that is performed in the write operation or an erase operation, the page buffer block 130 may sense voltages of the bit lines BL and may store the sensed voltages as sensing bits.

The data input and output block 140 is connected with the page buffer block 130 through the plurality of data lines DL. The data input and output block 140 may receive a column address CA from the buffer block 150. The data input and output block 140 may output data read by the page buffer block 130 to the buffer block 150 depending on the column address CA. The data input and output block 140 may provide data received from the buffer block 150 to the page buffer block 130, based on the column address CA.

The buffer block 150 may receive a command CMD and an address ADDR from an external device through a first channel CH1 and may exchange data "DATA" with the external device. The buffer block 150 may operate under control of the control logic block 170. The buffer block 150 may provide the command CMD to the control logic block 170. The buffer block 150 may provide the row address RA of the address ADDR to the row decoder block 120 and may provide the column address CA of the address ADDR to the data input and output block 140. The buffer block 150 may exchange the data "DATA" with the data input and output block 140.

The count block 160 may count the sensing bits stored in the page buffer block 130. For example, the count block 160 may count the number of bits, which corresponds to on-cells or off-cells, from among the sensing bits stored in the page buffer block 130. An on-cell may be a memory cell that is turned on in the read operation or the verify operation, and an off-cell may be a memory cell that is turned off in the read operation or the verify operation. The count block 160 may provide a count value to the control logic block 170.

The control logic block 170 may exchange control signals CTRL from the external device through a second channel CH2. The control logic block 170 may allow the buffer block 150 to route the command CMD, the address ADDR, and the data "DATA". The control logic block 170 may decode the command CMD received from the buffer block 150 and may control the nonvolatile memory device 100 based on the decoded command.

In an exemplary embodiment of the inventive concept, the control logic block 170 includes a 1-stage verify unit 171 (e.g., a first verify circuit) and a 2-stage verify unit 172 (e.g., a second verify circuit). In an exemplary embodiment, the 1-stage verify unit 171 performs a 1-stage verify (e.g., a first verify) in which it is determined whether memory cells are programmed to have intended threshold voltages by performing a verify in the program operation. In an exemplary embodiment, the 2-stage verify unit 172 performs a 2-stage verify (e.g., a second verify) in which it is determined whether a distribution of threshold voltages of memory cells is excessively expanded (or widened) due to factors, such as a progressive resistance, in the program operation.

In an exemplary embodiment, the memory cell array 110 is a core of the nonvolatile memory device 100. The row decoder block 120, the page buffer block 130, the data input and output block 140, the buffer block 150, the count block 160, and the control logic block 170 may belong to a peripheral circuit of the nonvolatile memory device 100. The peripheral circuit may be configured to access the core.

In an exemplary embodiment, the nonvolatile memory device 100 is manufactured in a bonding manner. The memory cell array 110 may be manufactured on a first wafer, and the row decoder block 120, the page buffer block 130, the data input and output block 140, the buffer block 150, and the control logic block 170 may be manufactured on a second wafer. The nonvolatile memory device 100 may be implemented by coupling the first wafer and the second wafer such that an upper surface of the first wafer and an upper surface of the second wafer face each other.

In another example, the nonvolatile memory device 100 is manufactured in a cell over peri (COP) manner. The peripheral circuit including the row decoder block 120, the page buffer block 130, the data input and output block 140, the buffer block 150, and the control logic block 170 may be implemented on a substrate. The memory cell array 110 may be implemented over the peripheral circuit. The peripheral circuit and the memory cell array 110 may be connected by using through vias.

Figure 2:
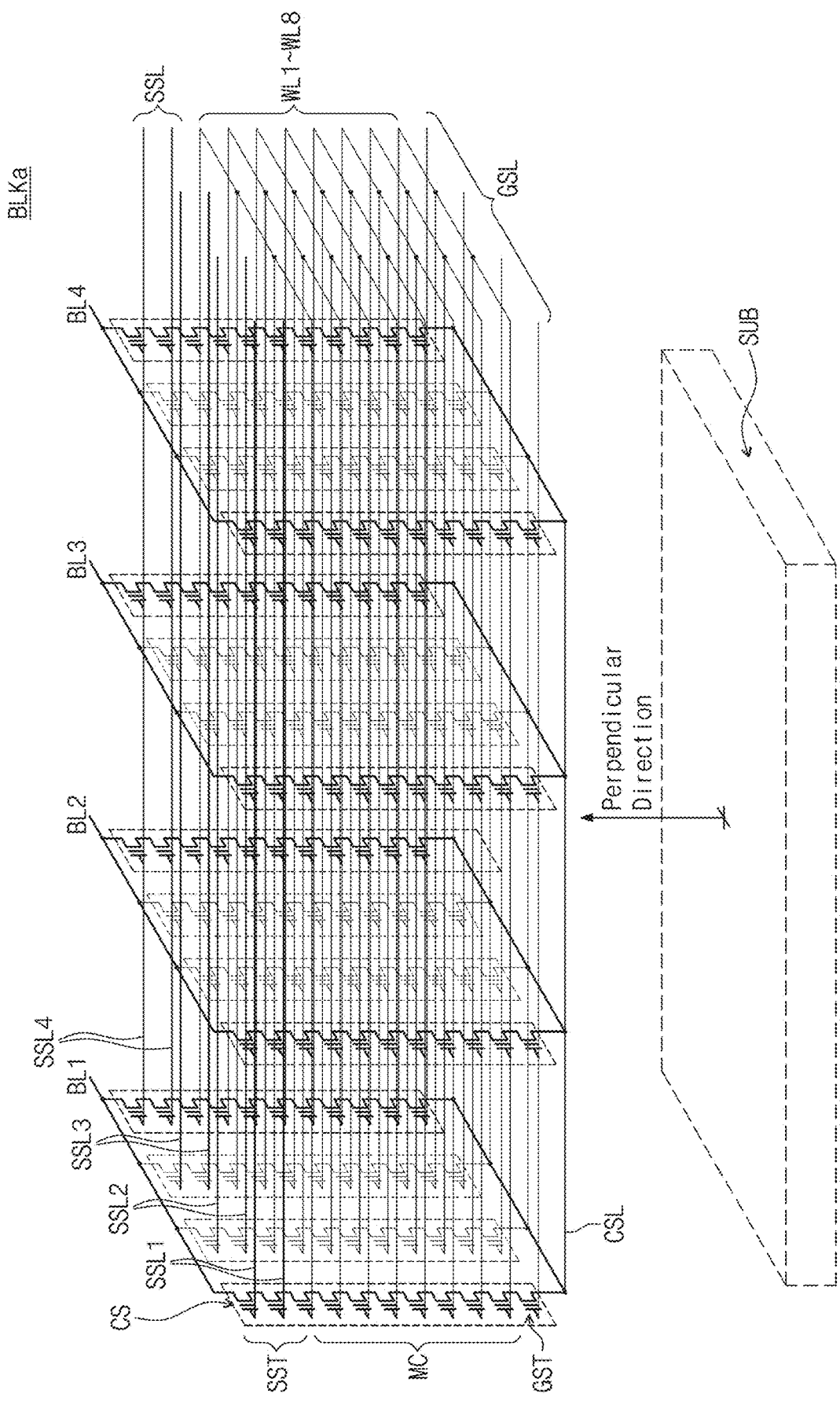
FIG. 2 is a circuit diagram illustrating an example of one memory block of memory blocks of FIG. 1.

FIG. 2 is a circuit diagram illustrating an example of a portion of one memory block BLKa of the memory blocks BLK1 to BLKz of FIG. 1. Referring to FIGS. 1 and 2, a plurality of cell strings CS may be arranged on a substrate SUB in rows and columns. The plurality of cell strings CS may be connected in common with a common source line CSL that is formed on (or in) the substrate SUB. In FIG. 2, a location of the substrate SUB is exemplified to aid a reader in understanding a structure of the memory block BLKa.

The cell strings CS of each row may be connected in common with the ground selection line GSL and with a corresponding string selection line of first to fourth string selection lines SSL1 to SSL4. Cell strings of each column may be connected with a corresponding one of first to fourth bit lines BL1 to BL4. The cell strings CS connected with the second and third string selection lines SSL2 and SSL3 are drawn with thinner lines to provide a less complex drawing for ease of understanding the structure of the memory block BLKa.

Each of the cell string CS may include at least one ground selection transistor GST connected to the ground selection line GSL, a plurality of memory cells MC1 to MC8 respectively connected with a plurality of word lines WL1 to WL8, and string selection transistors SST respectively connected with the string selection lines SSL1, SSL2, SSL3, or SSL4. Memory cells of the same height may be connected in common with the same word line.

In each of the cell strings CS, the ground selection transistor GST, the memory cells MC1 to MC8, and the string selection transistors SST may be connected in series along a direction perpendicular to the substrate SUB and may be sequentially stacked along the direction perpendicular to the substrate SUB. In each of the cell strings CS, at least one of the memory cells MC1 to MC8 may be used as a dummy memory cell. In an exemplary embodiment, the dummy memory cell is not programmed (e.g., may be program-inhibited) or is programmed differently from the remaining memory cells other than the dummy memory cell from among the memory cells MC1 to MC8.

The memory block BLKa may be provided in a three-dimensional (3D) memory array. The 3D memory array is monolithically formed in one or more physical levels of arrays of memory cells MC having an active area disposed above a silicon substrate and a circuit associated with the operation of those memory cells MC. The circuit associated with an operation of the memory cells MC may be located above or within such substrate. The term "monolithic" means that layers of each level of the array are directly deposited on the layers of each underlying level of the 3D memory array.

In an exemplary embodiment of the inventive concept, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
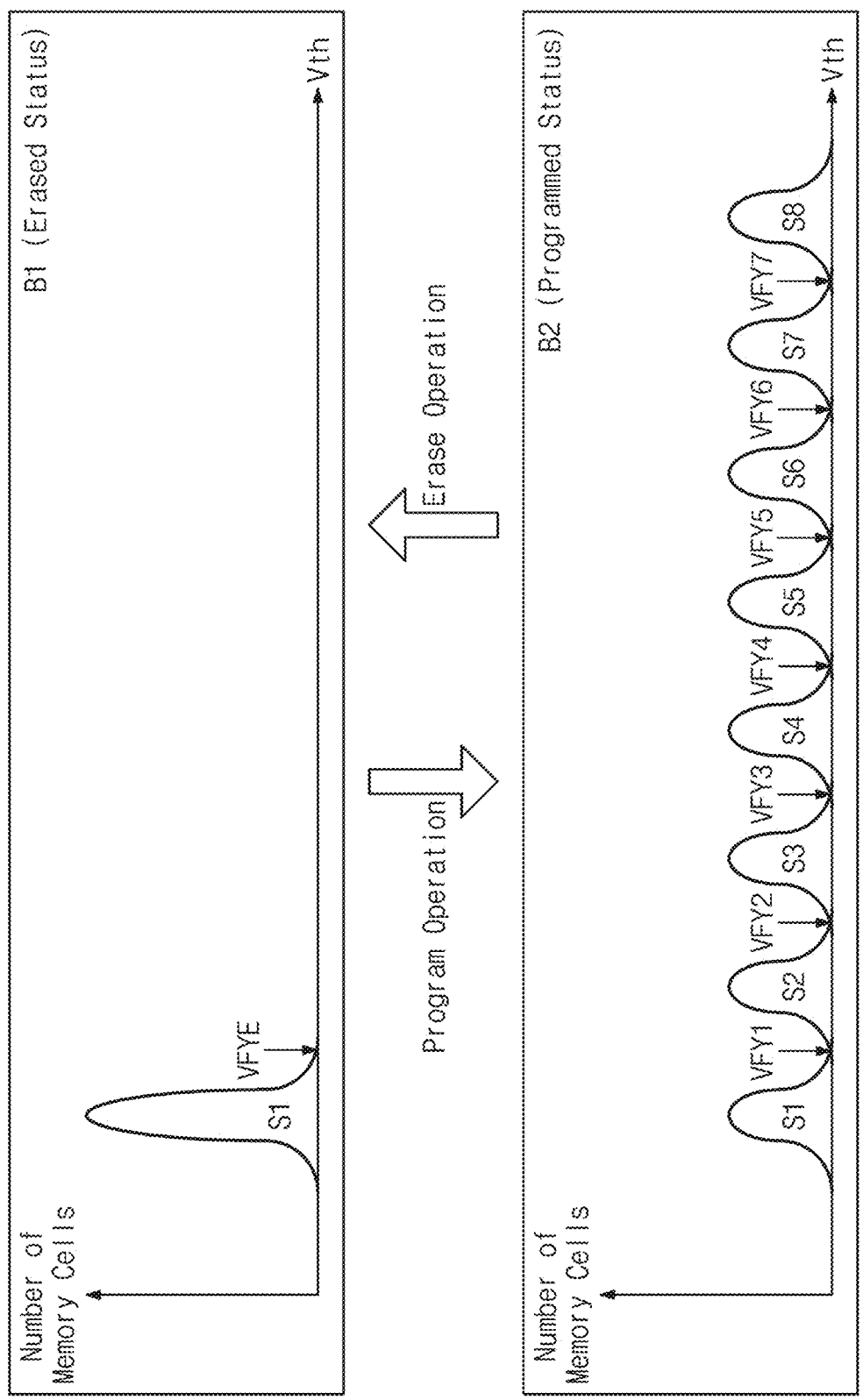
FIG. 3 illustrates examples in which threshold voltages of memory cells change due to a program operation and an erase operation.

FIG. 3 illustrates examples in which threshold voltages of memory cells MC change due to a program operation and an erase operation. In FIG. 3, a horizontal axis represents threshold voltages Vth of the memory cells MC, and a vertical axis represents the number of memory cells. In an embodiment, a change in threshold voltages when three bits are written in each memory cell is illustrated in FIG. 3. Referring to FIGS. 1, 2, and 3, a first block B1 illustrates an erased status where the memory cells are erased, and a second block B2 illustrates a programmed status where the memory cells MC are programmed.

As the program operation is performed, threshold voltages of the memory cells MC may be changed to first to eighth states S1 to S8 from the first state S1. As the erase operation is performed, the threshold voltages of the memory cells MC may be changed to the first state S1 from the first to eighth states S1 to S8. The first state S1 may be an erase state. The second to eighth states S2 to S8 may be program states.

In the program operation, first to seventh verify voltages VFY1 to VFY7 may be used. Memory cells to be programmed to the second state S2 may be programmed to have threshold voltages higher than the first verify voltage VFY1. Memory cells to be programmed to a k-th state Sk (k being an integer belonging to a range from 2 to 8) may be programmed to have threshold voltages higher than a (k-1)-th verify voltage VFYk-1.

In an embodiment, by using an error correction algorithm, it is determined that some memory cells of the memory cells to be programmed to the k-th state Sk have been completely programmed to the k-th state Sk even though these memory cells do not have threshold voltages higher than the (k-1)-th verify voltage VFYk-1. When the k-th state Sk is completely programmed, the k-th state Sk may be passed. For example, when memory cells scheduled to be programmed to the k-state Sk during a given period have achieved the k-th state Sk after the given period, it can be concluded that the k-th state has passed. When the k-th state Sk is not completely programmed, the k-th state Sk may fail. For example, when one or more of the memory cells scheduled to be programmed to the k-th state Sk during a given period have not achieved the k-th state Sk after the given period, it can be concluded that the k-th state Sk has failed.

The erase operation may be performed in a similar manner to the program operation. The erase operation may be performed by using an erase verify voltage VFYE. In the erase operation, the memory cells MC may be set to have threshold voltages lower than the erase verify voltage VFYE.

Figure 4:
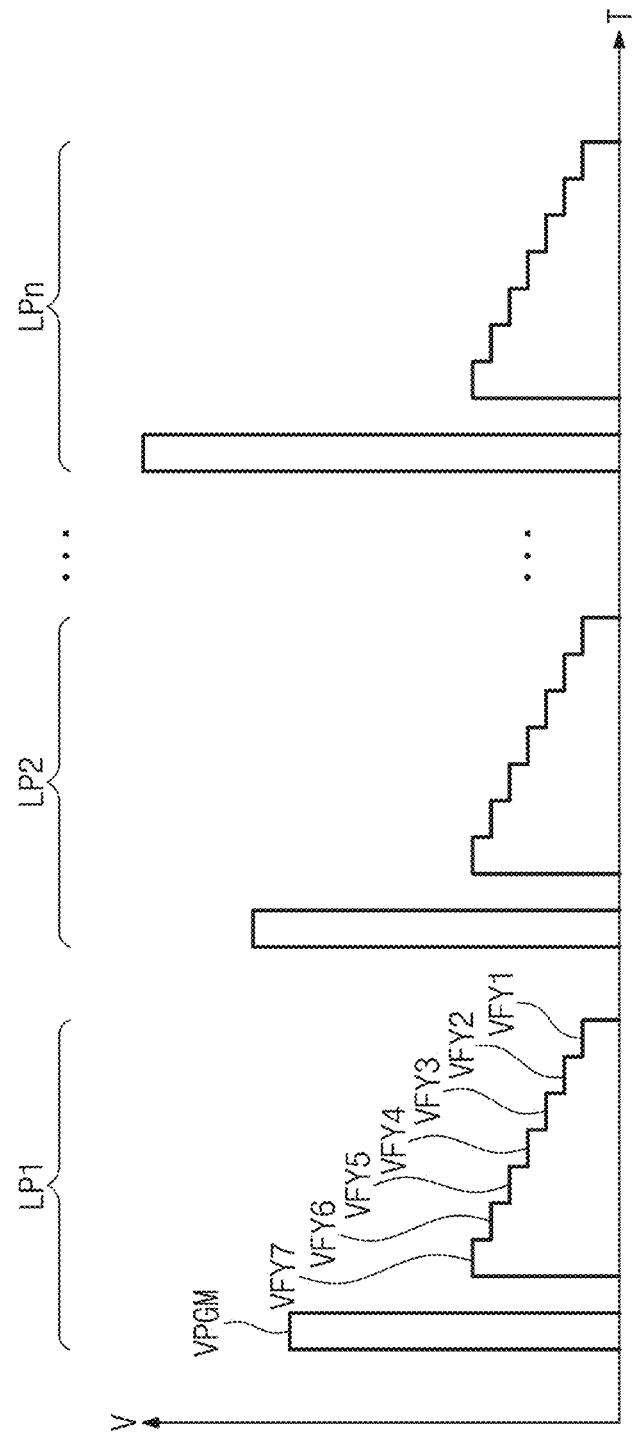
FIG. 4 illustrates an example of voltages to be applied to a word line selected by a row address in a program operation.

FIG. 4 illustrates an example of voltages to be applied to a word line selected by the row address RA in the program operation. For example, the word line is connected to a memory cell that is the target of the program operation and associated with the row address RA.

In FIG. 4, a horizontal axis represents a time "T", and a vertical axis represents a voltage "V". Referring to FIGS. 1, 2, 3, and 4, the program operation may include a plurality of program loops LP1 to LPn.

Each of the plurality of program loops LP1 to LPn may include a program to apply a program voltage VPGM and a 1-stage verify to apply first to seventh verify voltages VFY1 to VFY7.

In the program, the page buffer block 130 may apply first bias voltages to bit lines BL. The first bias voltages may include a first voltage to be applied to a bit line connected with a memory cell to be programmed and a second voltage to be applied to a bit line connected with a memory cell to be program-inhibited. Program-inhibited memory cells may include a memory cell maintaining the first state S1 or a memory cell programmed to have a threshold voltage higher than a verify voltage corresponding to a state to be programmed from among the first to seventh verify voltages VFY1 to VFY7.

In the program, by adjusting voltages to be applied to the string selection lines SSL1 to SSL4 based on the address ADDR, the row decoder block 120 selects memory cells of a selected row from among memory cells connected with a selected word line as a program target and does not select memory cells of the remaining rows (or unselected rows) as a program target.

In the program, the row decoder block 120 applies the program voltage VPGM to the selected word line and applies a pass voltage VPASS to unselected word lines. The program voltage VPGM may allow threshold voltages of the selected memory cells to increase. The pass voltage VPASS may prevent threshold voltages of unselected memory cells from increasing.

In the verify, the page buffer block 130 may apply second bias voltages to the bit lines BL. The second bias voltages may include a precharge voltage that is used to precharge bit lines to a positive level.

In the verify, by adjusting voltages to be applied to the string selection lines SSL1 to SSL4 based on the address ADDR, the row decoder block 120 selects memory cells of a selected row from among memory cells connected with a selected word line as a verify target and does not select memory cells of the remaining rows (or unselected rows) as a verify target.

In the verify, the row decoder block 120 may sequentially apply the first to seventh verify voltages VFY1 to VFY7 to the selected word line. For example, the row decoder block 120 may apply the seventh verify voltage VFY7 to the selected word line and may apply a read pass voltage VREAD to unselected word lines. The read pass voltage VREAD may turn on the memory cells MC.

The page buffer block 130 may sense voltages of the bit lines BL and may store the sensed voltages as first sensing bits. The page buffer block 130 may store the first sensing bits corresponding to memory cells to be programmed to the eighth state S8 from among the first sensing bits.

In the verify, the row decoder block 120 may apply the (k-1)-th verify voltage VFYk-1 to a selected word line, and the page buffer block 130 may store voltages of the bit lines BL as the first sensing bits. The page buffer block 130 may store the first sensing bits corresponding to memory cells to be programmed to the k-th state Sk from among the first sensing bits.

The page buffer block 130 may output the first sensing bits corresponding to the memory cells to be programmed to the k-th state Sk from among the first sensing bits to the count block 160. The count block 160 may count the number of first sensing bits corresponding to on-cells to generate a count value, that is, memory cells having threshold voltages not higher than the (k-1)-th verify voltage VFYk-1, from among the first sensing bits thus received.

The control logic block 170 may receive the count value from the count block 160. When the count value is greater than a first threshold value, the control logic block 170 may determine the k-th state Sk as a pass. When the count value is the first threshold value or smaller, the control logic block 170 may determine the k-th state Sk as a fail. When the k-th state Sk is determined as a pass, the (k-1)-th verify voltage VFYk-1 is not applied during a next program loop.

As described with reference to FIG. 2, the memory cells MC are stacked to be perpendicular to the substrate SUB. As such, a vertical via for connecting the row decoder block 120 and the word lines WL1 to WL8 connected with the memory cells MC may become high. As the vertical via becomes higher or longer, a defect may occur within the vertical via itself or at a connection between the vertical via and the word lines WL1 to WL8.

Defects, which appear clearly, such as a short-circuit and an open-circuit, may be screened out during a process of testing the nonvolatile memory device 100. However, a defect such as a progressive resistance is a progressive defect that selectively appears depending on an environment change. The progressive defect may fail to be completely screened out in the process of testing the nonvolatile memory device 100.

In the case where the progressive resistance occurs, a resistance of a specific word line may increase to a larger than intended resistance. An increase in resistance of a word line may cause a decrease in a voltage level of the word line. In the case where the resistance of the word line again decreases in a situation where a voltage is applied to the word line, an overshoot may occur at the voltage of the word line.

As illustrated in FIG. 4, the program operation includes the program loops LP1 to LPn in which various voltages are repeatedly applied. In the case where the progressive resistance occurs in the program operation, a distribution of threshold voltages of memory cells may be widened. For example, the various voltages may be sequentially applied to a given word line.

An example is illustrated in FIG. 4 where the verify voltages VFY1 to VFY7 are sequentially applied in descending order from highest to lowest values. However, this is only exemplary. The verify voltages VFY1 to VFY7 may be sequentially applied in ascending order from lowest to highest values, or may be sequentially applied in an order that is not associated with levels. Orders in which verify voltages are applied may be identically applied to drawings to be mentioned below.

Figure 5:
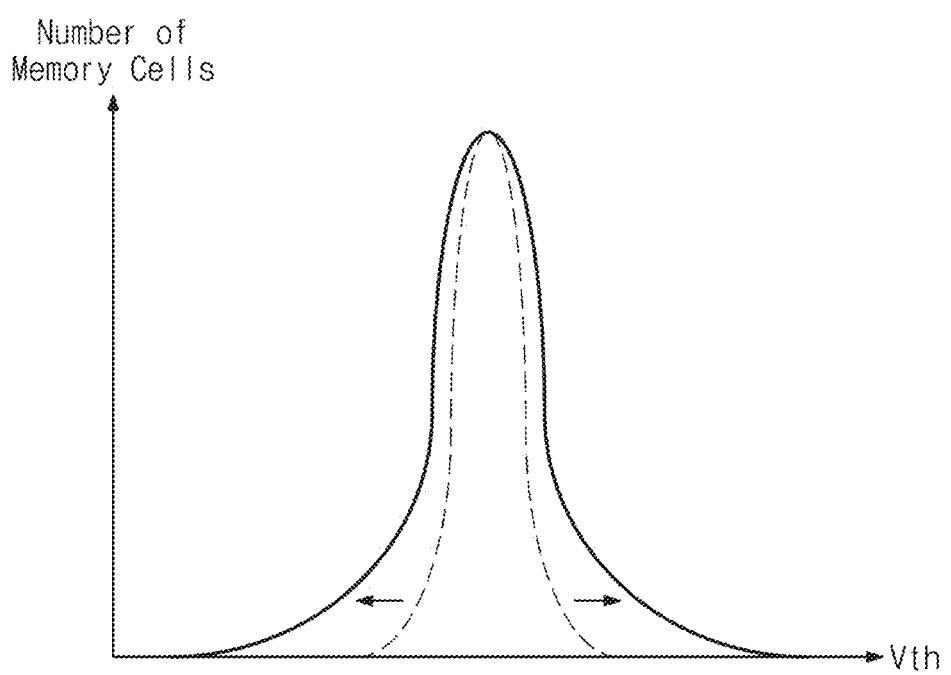
FIG. 5 illustrates an example in which a threshold voltage distribution of memory cells changes due to a progressive resistance.

FIG. 5 illustrates an example in which a threshold voltage distribution of memory cells changes due to a progressive resistance. In FIG. 5, a horizontal axis represents threshold voltages Vth of memory cells, and a vertical axis represents the number of memory cells. In an embodiment, a threshold voltage distribution corresponding to one state is illustrated in FIG. 5.

Referring to FIG. 5, a dotted line indicates a threshold voltage distribution formed by a program operation when the progressive resistance does not occur. A solid line indicates a threshold voltage distribution formed by a program operation when the progressive resistance occurs. As illustrated in FIG. 5, the progressive resistance may make a threshold voltage distribution widen both toward a high level and toward a low level.

Figure 6:
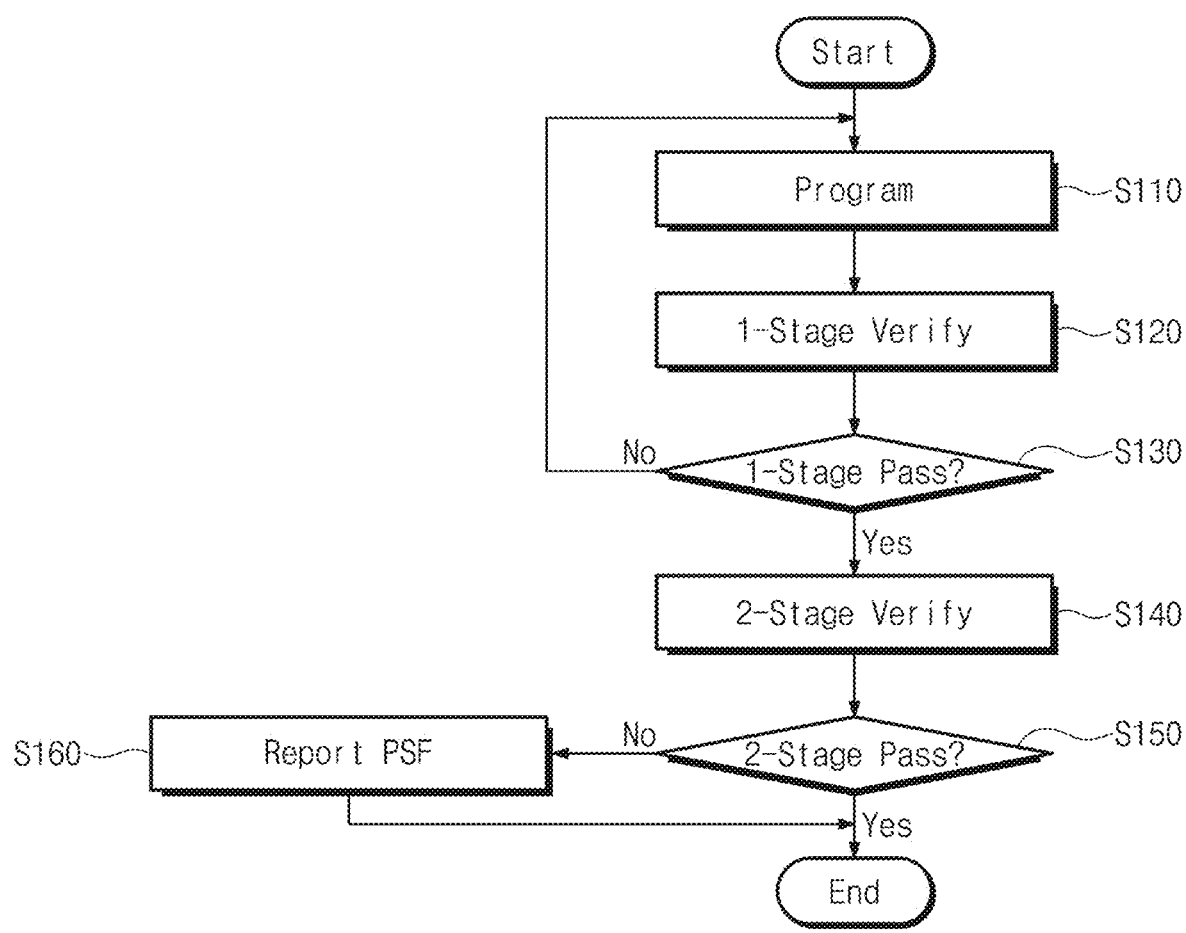
FIG. 6 illustrates an operating method of a nonvolatile memory device according to an exemplary embodiment of the inventive concept.

FIG. 6 illustrates an operating method of the nonvolatile memory device 100 according to an exemplary embodiment of the inventive concept. In an embodiment, an example in which a distribution corresponding to one target state is formed through a program operation is illustrated in FIG. 6. Referring to FIGS. 1, 4, and 6, in operation S110, the nonvolatile memory device 100 performs a program. In operation S120, the nonvolatile memory device 100 performs a 1-stage verify.

When the 1-stage verify fails, that is, when the target state fails, operation S110 is again performed. For example, when it cannot be determined that the target state has been achieved, operation S110 is again programmed. When the 1-stage verify passes, that is, when the target state is passed, operation S140 is performed. For example, when it is determined that the target state has been achieved, operation S140 is performed. In operation S140, the nonvolatile memory device 100 performs the 2-stage verify.

In an exemplary embodiment of the inventive concept, In the 2-stage verify, the row decoder block 120 applies an additional verify voltage different from the verify voltage of the 1-stage verify to a selected word line. The page buffer block 130 may sense voltages of the bit lines BL and may store the sensed voltages as third sensing bits.

In operation S150, the nonvolatile memory device 100 determines whether the 2-stage verify is a pass or a fail, based on the third sensing bits. For example, the page buffer block 130 may provide third sensing bits corresponding to the target state from among the third sensing bits to the count block 160.

The count block 160 may count the number of first values being third sensing bits corresponding to on-cells (i.e., memory cells having threshold voltages not higher than the additional verify voltage) from among the third sensing bits provided from the page buffer block 130 to generate a count value or may count the number of second values being third sensing bits corresponding to off-cells (i.e., memory cells having threshold voltages higher than the additional verify voltage) from among the third sensing bits provided from the page buffer block 130 to generate the count value.

The control logic block 170 may receive the count value from the count block 160. In an exemplary embodiment of the inventive concept, when the count value is smaller than a second threshold value, the control logic block 170 determines the 2-stage verify as a pass. In an exemplary embodiment, when the count value is the second threshold value or greater, the control logic block 170 determines the 2-stage verify as a fail.

When the 2-stage verify is determined as a pass, the program of the target state is passed (e.g., succeeds) and is terminated. When the 2-stage verify is determined as a fail, operation S160 is performed. In operation S160, the control logic block 170 may determine the program operation failed in response to the fail of the 2-stage verify. The control logic block 170 may transmit a signal of a program state fail PSF to an external device through the second channel CH2. The signal may indicate that the program of one or more memory cells has failed.

Figure 7:
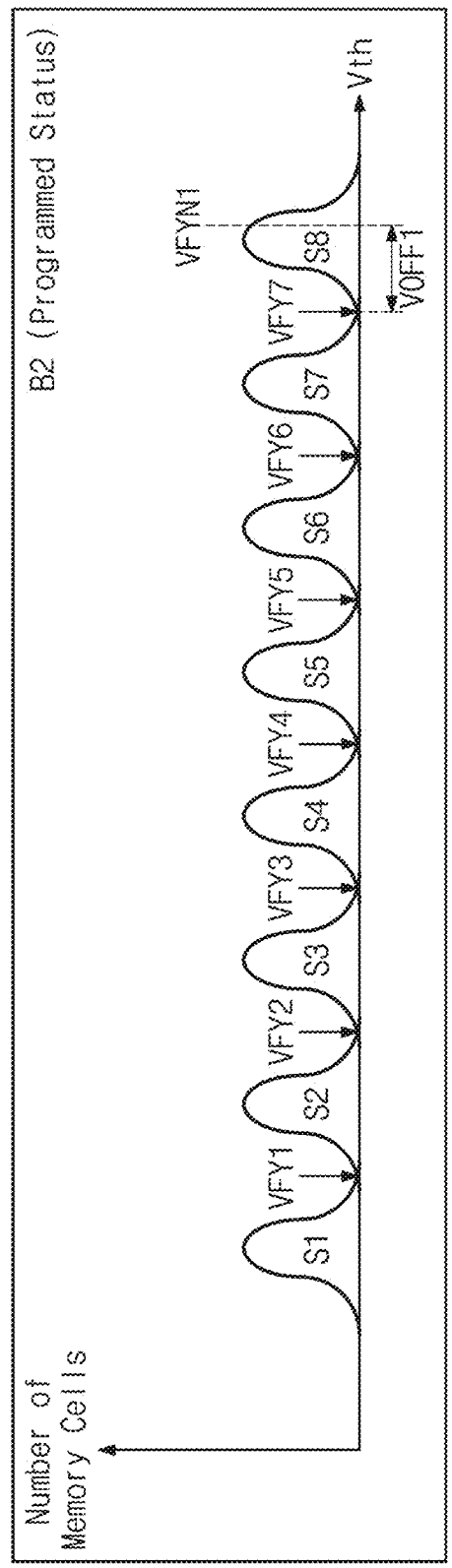
FIG. 7 illustrates an example of a first additional verify voltage.

FIG. 7 illustrates an example of a first additional verify voltage VFYN1. Compared to the second block B2 of FIG. 3, the first additional verify voltage VFYN1 is associated with a state corresponding to the highest threshold voltage, that is, the eighth state S8. In the case where a higher state than the eighth state S8 exists as the number of bits to be written per memory cell increases, the first additional verify voltage VFYN1 may be associated with the highest state.

The first additional verify voltage VFYN1 may be designated as a first offset VOFF1 (e.g., a first offset voltage) associated with the verify voltage VFY7 of the eighth state S8. The first offset VOFF1 may include a sign (e.g., positive or negative) and a voltage. A level of the first additional verify voltage VFYN1 may be obtained by applying an offset defined by the first offset VOFF1 to a level of the seventh verify voltage VFY7. For example, the first offset VOFF1 may be added to the seventh verify voltage VFY7 to generate the first additional verify voltage VFYN1.

The first to seventh verify voltages VFY1 to VFY7 may adaptively change depending on an environment change of the nonvolatile memory device 100. The first additional verify voltage VFYN1 may also adaptively change depending on an environment change by setting the first additional verify voltage VFYN1 to the first offset VOFF1.

Figure 8:
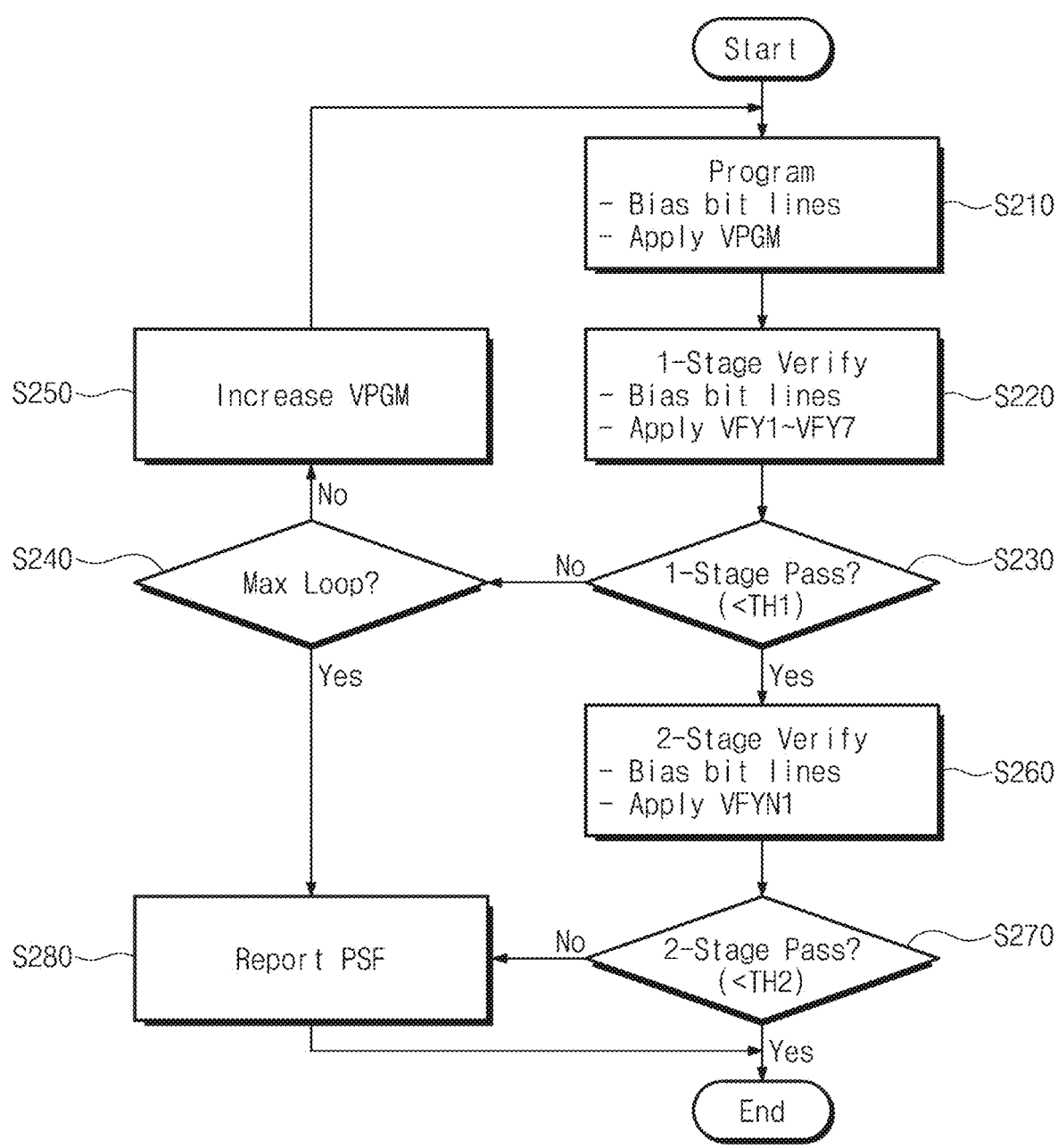
FIG. 8 illustrates a first example of a method of performing a program operation by using first to seventh verify voltages and a first additional verify voltage of FIG. 7.
Figure 9:
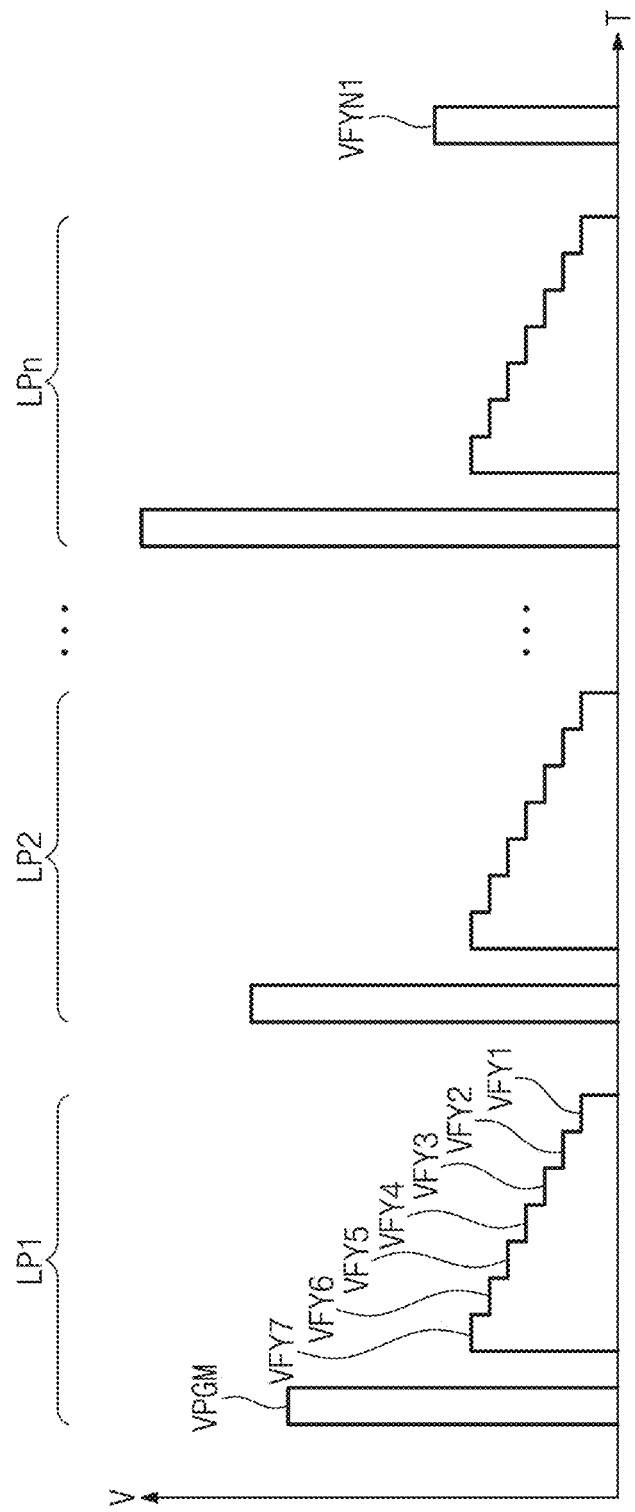
FIG. 9 illustrates an example of program loops according to the method of FIG. 8.

FIG. 8 illustrates a first example of a method of performing a program operation by using the first to seventh verify voltages VFY1 to VFY7 and the first additional verify voltage VFYN1 of FIG. 7. FIG. 9 illustrates an example of the program loops LP1 to LPn according to the method of FIG. 8.

Referring to FIGS. 1, 7, 8, and 9, in operation S210, the nonvolatile memory device 100 performs a program. The page buffer block 130 may bias bit lines with first bias voltages. The row decoder block 120 may apply the program voltage VPGM to a selected word line.

In operation S220, the nonvolatile memory device 100 performs the 1-stage verify. The page buffer block 130 may bias the bit lines with second bias voltages. In an exemplary embodiment of the inventive concept, during the 1-stage verify, the row decoder block 120 applies the first to seventh verify voltages VFY1 to VFY7 to the selected word line. The voltages that are applied to the selected word line in operation S210 and operation S220 may correspond to the first to n-th loops LP1 to LPn.

The page buffer block 130 may provide the count block 160 with first sensing bits that are sensed when a verify voltage corresponding to each of the second to eighth states S2 to S8 is applied. The count block 160 may count the number of bits corresponding to on-cells from among the first sensing bits thus received.

In operation D230, the nonvolatile memory device 100 determines whether the 1-stage verify is a pass. When a count value received from the control logic block 170 is smaller than a first threshold value TH1, the control logic block 170 determines a state corresponding to the count value from among the second to eighth states S2 to S8 as a pass. When all the second to eighth states S2 to S8 are determined as a pass, the control logic block 170 may determine the 1-stage verify as a pass. The first threshold value TH1 may be different for each of the second to eighth states S2 to S8.

When the 1-stage verify is not determined as a pass, operation S240 is performed. In operation S240, the control logic block 170 determines whether the number of times of repetition of a program loop reaches a given maximum loop count. When the number of times of repetition of the program loop does not reach the given maximum loop count, the program voltage VPGM is increased in operation S250, and operation S210 is again performed. For example, operation S120 is performed using the increased program voltage VPGM. When the number of times of repetition of the program loop reaches the given maximum loop count, operation S280 is performed.

When the 1-stage verify is determined as a pass, operation S260 is performed. In operation S260, the 2-stage verify is performed. The page buffer block 130 may apply third bias voltages to the bit lines BL to bias the bit lines BL. The third bias voltages may be equal or similar to the second bias voltages.

In an exemplary embodiment of the inventive concept, the row decoder block 120 applies the first additional verify voltage VFYN1 to the selected word line during the 2-stage verify and applies the read pass voltage VREAD to unselected word lines. The first additional verify voltage VFYN1 that is applied to the selected word line in operation S260 may be marked after the n-th loop LPn. In an exemplary embodiment, the first additional verify voltage VFYN1 is higher than the voltages used during the 1-stage verify.

The page buffer block 130 may provide second sensing bits to the count block 160. The count block 160 may count the number of memory cells having threshold voltages higher than the first additional verify voltage VFYN1 by counting the number of values corresponding to off-cells.

In operation S270, the nonvolatile memory device 100 determines whether the 2-stage verify is a pass. When a count value received from the control logic block 170 is smaller than a second threshold value TH2, the control logic block 170 determines the 2-stage verify as a pass. When the 2-stage verify is determined as a pass, the control logic block 170 determines a pass of the program operation (e.g., program operation has succeeded) and may terminate the program operation.

When the stage verify is determined as a fail or when the number of times of repetition of a program loop reaches the given maximum loop count, in operation S280, the control logic block 170 determines the program operation has failed and may terminate the program operation. The control logic block 170 may report a signal indicating the program state fail PSF to the external device.

As described above, the nonvolatile memory device 100 according to an exemplary embodiment of the inventive concept detects whether threshold voltages of memory cells are excessively widened, together with performing the program operation. When it is determined that the threshold voltages of the memory cells are excessively widened, an uncorrectable error may occur in a read operation after the program operation. That is, data may be lost. For example, data read as a result of the read operation may include an error that it is difficult or impossible to correct when the threshold voltages have been excessively widened.

The nonvolatile memory device 100 according to an exemplary embodiment of the inventive concept may guide a reprogram of data by reporting a failure of the program operation to an external device when an excessive distribution of threshold voltages is detected. Also, the nonvolatile memory device 100 may notify the external device that a progressive resistance has occurred. Accordingly, it is possible to prevent a loss of data and to detect and process the progressive resistance, and the reliability of the nonvolatile memory device 100 may be improved.

Figure 10:
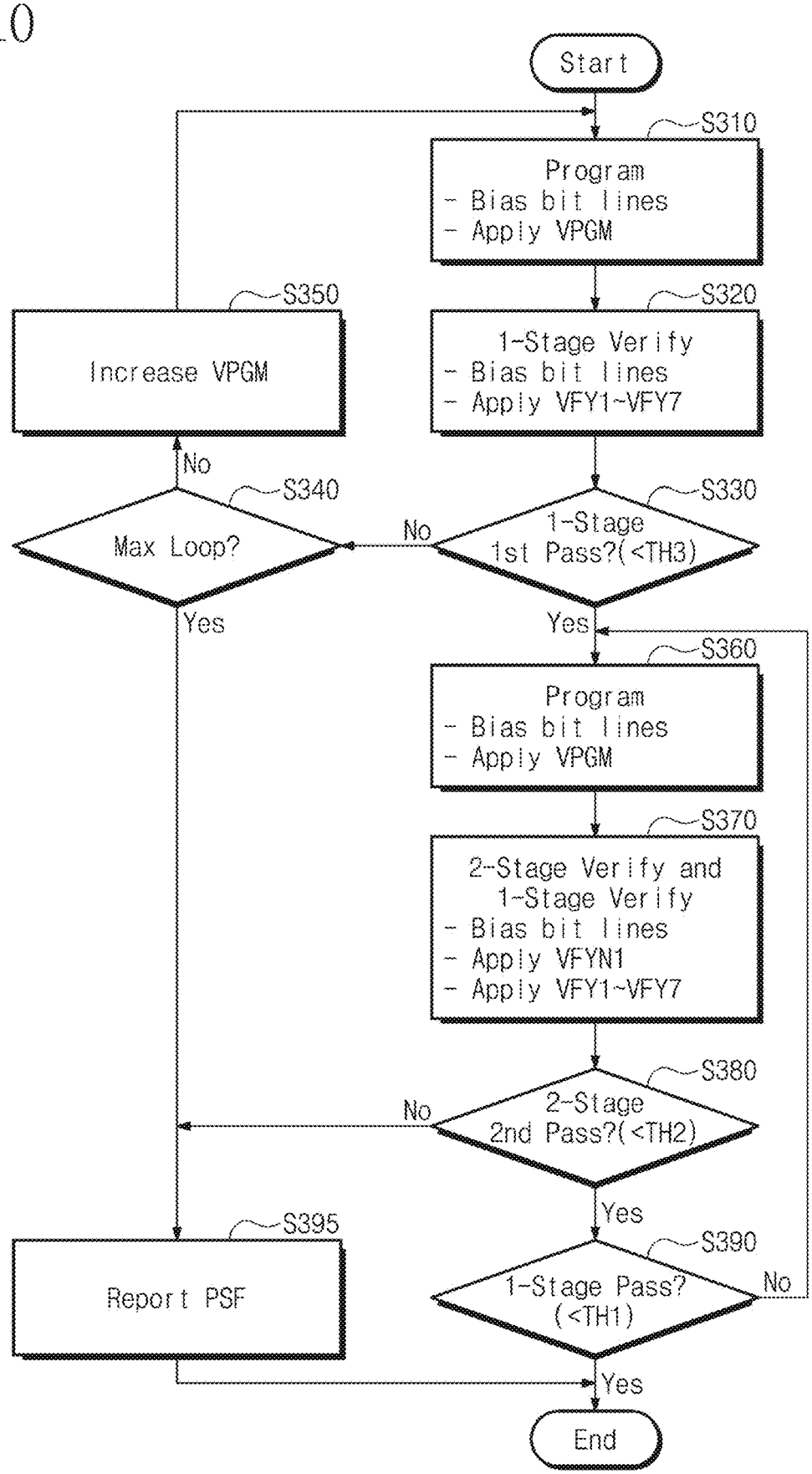
FIG. 10 illustrates a second example of a method of performing a program operation by using first to seventh verify voltages and a first additional verify voltage VFYN1 of FIG. 7.
Figure 11:
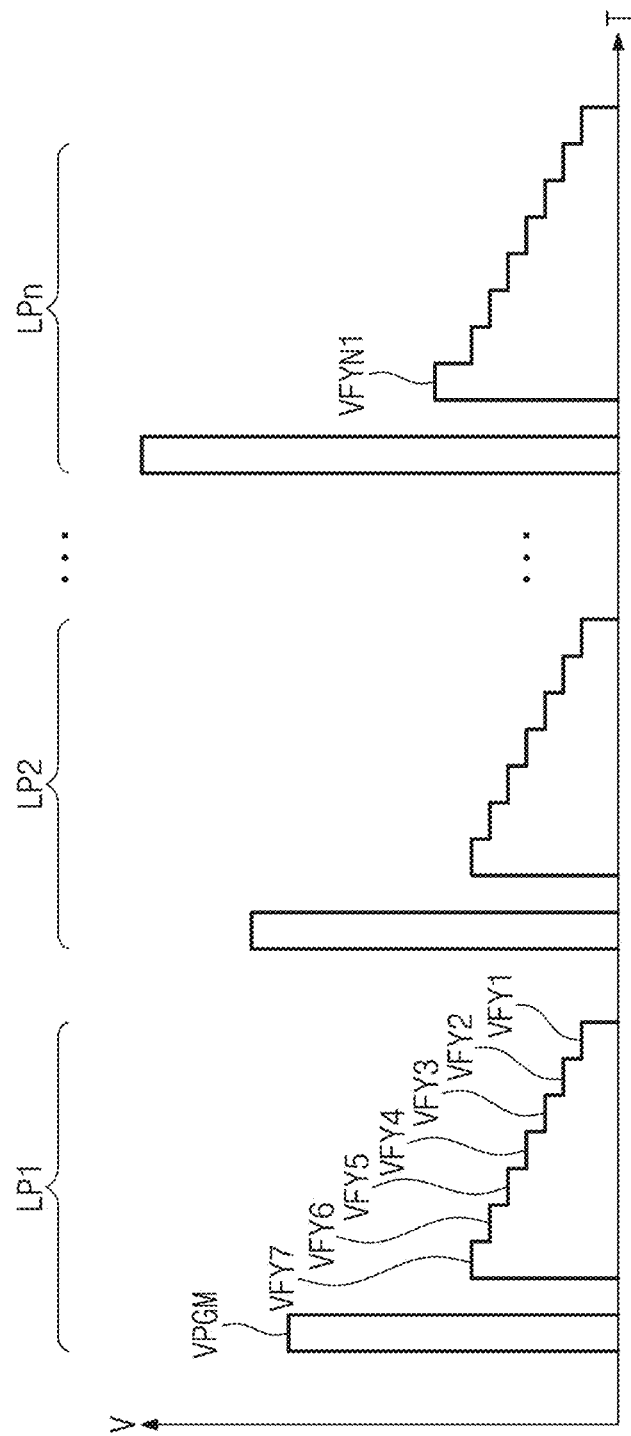
FIG. 11 illustrates an example of program loops according to the method of FIG. 10.

FIG. 10 illustrates a second example of a method of performing a program operation by using the first to seventh verify voltages VFY1 to VFY7 and the first additional verify voltage VFYN1 of FIG. 7. FIG. 11 illustrates an example of the program loops LP1 to LPn according to the method of FIG. 10. Referring to FIGS. 1, 7, 10, and 11, the nonvolatile memory device 100 performs the program in operation S310 and performs the 1-stage verify in operation S320. Operation S310 and operation S320 may be performed to be identical to operation S210 and operation S220.

In operation S330, the nonvolatile memory device 100 determines whether the 1-stage verify is a first pass (e.g., a first verify using a third threshold value TH3). The control logic block 170 may receive a count value from the count block 160 and compare the count value with a third threshold value TH3. The third threshold value TH3 may be greater than the first threshold value TH1.

Operation S330 may be interpreted as an operation of predicting (or determining) whether a count value is smaller than the first threshold value TH1 in a next loop, that is, whether the 1-stage pass (a second pass in FIG. 10) is determined. Operation S330 may be performed to be identical to operation S130 except that the third threshold value TH3 is used. For example, when a count value received from the control logic block 170 is smaller than a third threshold value TH3, the control logic block 170 determines a state corresponding to the count value from among the second to eighth states S2 to S8 as a pass. When all the second to eighth states S2 to S8 are determined as a pass, the control logic block 170 may determine the 1-stage verify as a pass.

When a first fail of the 1-stage verify is determined, in operation S340, the nonvolatile memory device 100 determines whether a current loop count is a maximum loop count. Operation S340 may be performed to be identical to operation S240. When the current loop count does not reach the maximum loop count, the program voltage VPGM is increased in operation S350, and operation S310 is again performed. When the current loop count reaches the maximum loop count, operation S395 is performed.

When the first pass of the 1-stage verify is determined, in operation S360, the nonvolatile memory device 100 performs the program. In operation S370, the nonvolatile memory device 100 performs the 2-stage verify and the 1-stage verify together. The voltages that are applied to the selected word line in operation S360 and operation S370 are marked at the n-th loop LPn.

In operation S380, the nonvolatile memory device 100 determines whether the 2-stage verify (e.g., a second verify using the second threshold value TH2) is a pass or a fail. Operation S380 may be performed to be identical to operation S270. For example, when a count value received from the control logic block 170 is smaller than a second threshold value TH2, the control logic block 170 determines the 2-stage verify as a pass. When the 2-stage verify is a fail or the current loop count reaches the maximum loop count, in operation S395, the nonvolatile memory device 100 determines the program operation has failed and may output a signal of the program state fail PSF.

When the 2-stage verify is a pass, in operation S390, the nonvolatile memory device 100 determines whether the 1-stage verify is a second pass or a second fail, by using the first threshold value TH1 (e.g., a third verify using the first threshold value TH1). Operation S380 may be performed to be identical to operation S230.

When the 1-stage verify (e.g., the third verify) is the second fail, operation S360 may be again performed. In an embodiment, as described with reference to operation S340 and operation S350, the nonvolatile memory device 100 may determine whether the current loop count reaches the maximum loop count; when the current loop count does not reach the maximum loop count, the nonvolatile memory device 100 may increase the program voltage VPGM and then may again perform operation S360.

When the 2-stage verify is the second pass, the nonvolatile memory device 100 may determine a pass of the program operation (e.g., program operation has succeeded) and may terminate the program operation. When the 2-stage verify is the second pass and the 1-stage verify using the first threshold value TH1 is a pass, the nonvolatile memory device 100 may determine a pass of the program operation.

In an embodiment, as described with reference to FIG. 10, after the first pass of the 1-stage verify, the nonvolatile memory device 100 may repeat the n-th loop LPn, in which the first additional verify voltage VFYN1 and the first to seventh verify voltages VFY1 to VFY7 are applied, until the second pass of the 1-stage verify is determined (or may increase the program voltage VPGM until the second pass of the 1-stage verify is determined).

In another example, the nonvolatile memory device 100 may perform the 2-stage verify in operation S380 only once. When the 2-stage verify is passed, afterwards, the 2-stage verify may be omitted. When the second fail of the 1-stage verify is determined at the n-th loop LPn, loops identical to the first and second loops LP1 and LP2 may be performed following the n-th loop LPn (or the program voltage VPGM may be increased following the n-th loop LPn).

Figure 12:
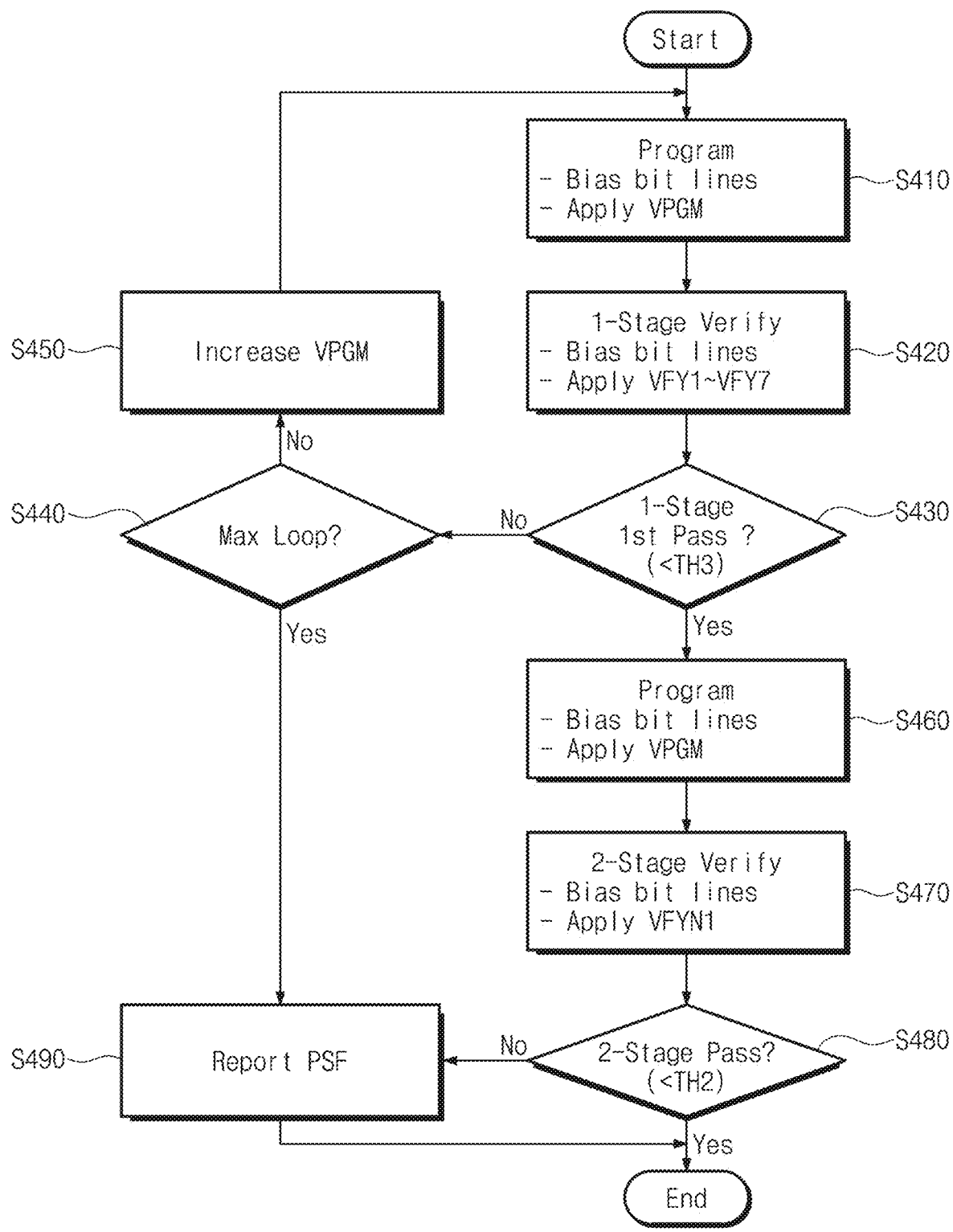
FIG. 12 illustrates a third example of a method of performing a program operation by using first to seventh verify voltages and a first additional verify voltage of FIG. 7.
Figure 13:
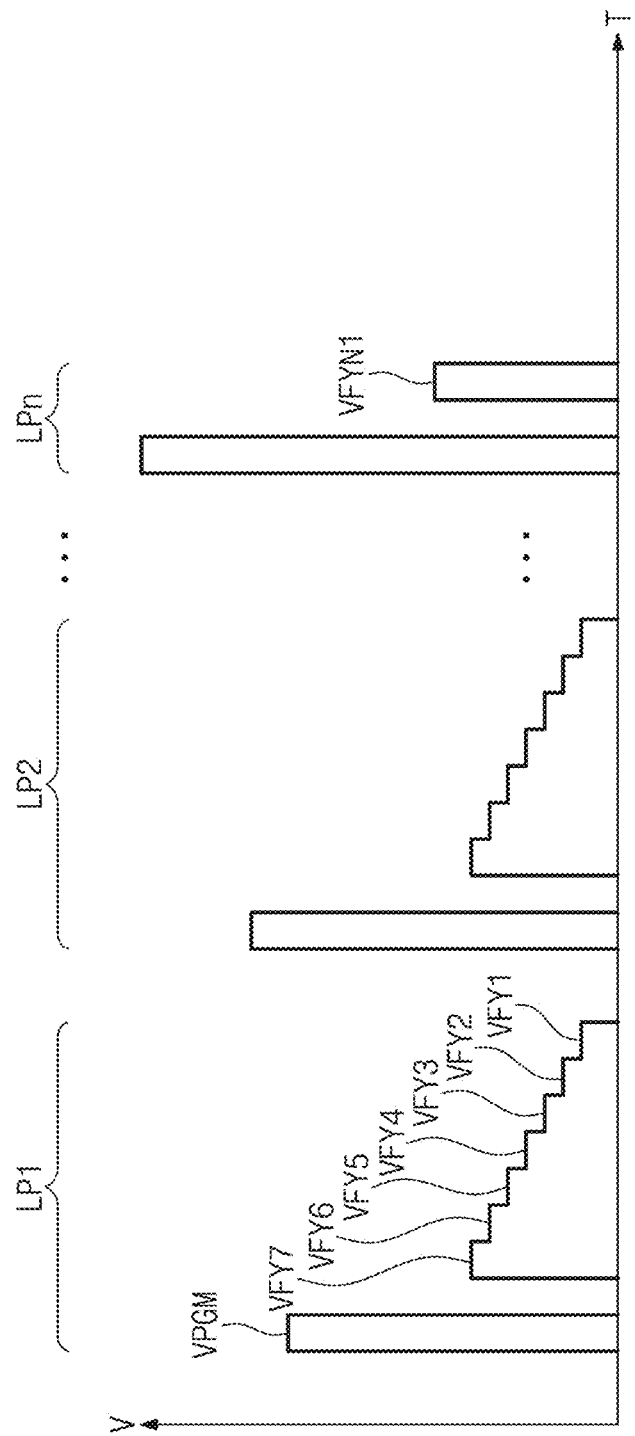
FIG. 13 illustrates an example of program loops according to the method of FIG. 12.

FIG. 12 illustrates a third example of a method of performing a program operation by using the first to seventh verify voltages VFY1 to VFY7 and the first additional verify voltage VFYN1 of FIG. 7. FIG. 13 illustrates an example of the program loops LP1 to LPn according to the method of FIG. 12. Referring to FIGS. 1, 7, 12, and 13, the nonvolatile memory device 100 performs the program in operation S410 and performs the 1-stage verify in operation S420. Operation S410 and operation S420 may be performed to be identical to operation S310 and operation S320, respectively.

In operation S430, the nonvolatile memory device 100 determines whether the 1-stage verify is a first pass or a first fail. Operation S430 may be performed to be identical to operation S330.

When the first fail of the 1-stage verify is determined, in operation S440, the nonvolatile memory device 100 determines whether a current loop count is a maximum loop count. Operation S440 may be performed to be identical to operation S340. When the current loop count does not reach the maximum loop count, the program voltage VPGM is increased in operation S450, and operation S410 may be again performed. When the current loop count reaches the maximum loop count, operation S490 is performed.

When the first pass of the 1-stage verify is determined, in operation S460, the nonvolatile memory device 100 performs the program. In operation S470, the nonvolatile memory device 100 performs the 2-stage verify. The voltages that are applied to the selected word line in operation S460 and operation S470 are marked at the n-th loop LPn.

In operation S480, the nonvolatile memory device 100 determines whether the 2-stage verify is a pass or a fail. Operation S480 may be performed to be identical to operation S380. When the 2-stage verify is a fail or the current loop count reaches the maximum loop count, in operation S490, the nonvolatile memory device 100 determines the program operation has failed and may output a signal of the program state fail PSF.

When the stage verify is a pass, the nonvolatile memory device 100 determine a pass of the program operation (e.g., program operation has succeeded) and may terminate the program operation. For example, when the 1-stage verify and the 2-stage verify are determined as a pass, the nonvolatile memory device 100 determine a pass of the program operation.

That is, when the 1-stage verify is determined as the first pass or the second pass is predicted, the nonvolatile memory device 100 may omit the 1-stage verify and may perform the program and the 2-stage verify.

Figure 14:
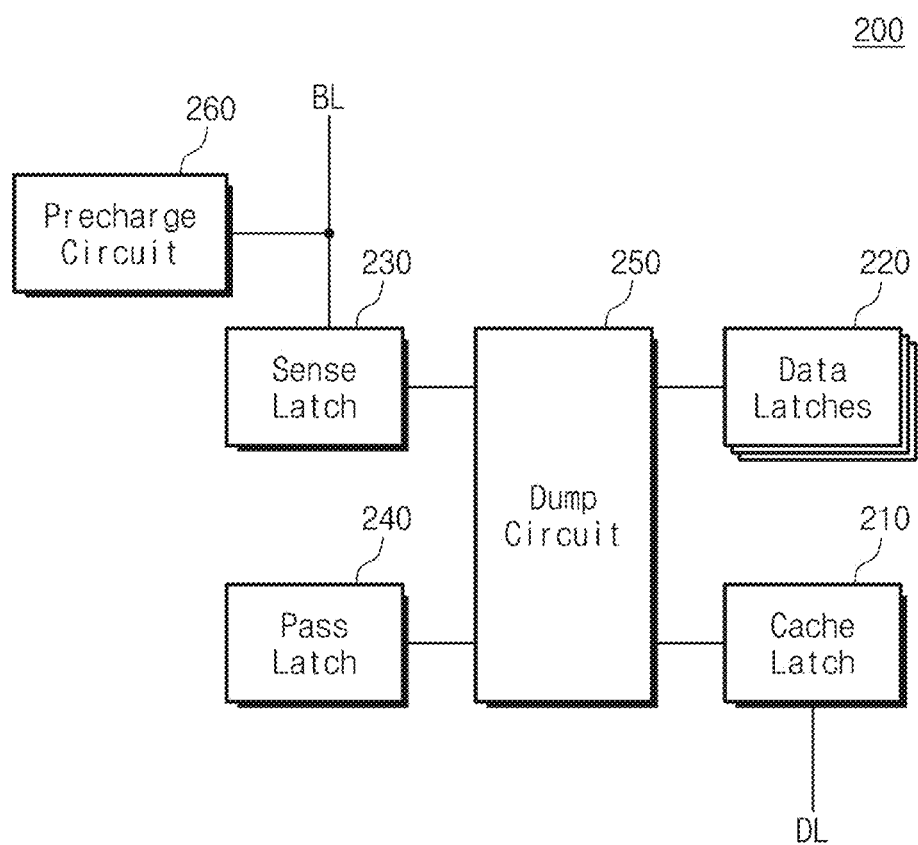
FIG. 14 illustrates an example of one page buffer corresponding to one bit line from among components of a page buffer block.

FIG. 14 illustrates an example of one page buffer 200 corresponding to one bit line BL from among components of the page buffer block 130. Referring to FIGS. 1 and 14, the page buffer 200 includes a cache latch 210 (e.g., a latch circuit), data latches 220 (e.g., latch circuits), a sense latch 230 (e.g., a latch circuit), a pass latch 240 (e.g., a latch circuit), a dump circuit 250, and a precharge circuit 260.

The cache latch 210 may be connected with a data line DL. The cache latch 210 may store a bit received through the data line DL or may output a stored bit through the data line DL.

The data latches 220 may store data (hereinafter referred to as "write bits") to be written in a memory cell connected with the bit line BL. The sense latch 230 may sense a voltage of the bit line BL and may store the sensed voltage as a sensing bit. The pass latch 240 may store information indicating whether a program operation of a memory cell connected with the bit line BL is a pass or a fail.

The dump circuit 250 may transmit bits between the cache latch 210, the data latches 220, the sense latch 230, and the pass latch 240 under control of the control logic block 170. The precharge circuit 260 may bias the bit line BL under control of the control logic block 170.

In a program operation, write bits may be sequentially stored in the cache latch 210. The dump circuit 250 may dump the respective write bits sequentially stored in the cache latch 210 into the data latches 220.

In a program of the program operation, the dump circuit 250 may dump the write bits stored in the data latches 220 to the sense latch 230. As such, the sense latch 230 may be set in such a way that one of a first voltage and a second voltage among first bias voltages is applied to the bit line BL.

In sensing of the program operation, the precharge circuit 260 may apply a second bias voltage to the bit line BL. The sense latch 230 may sense a voltage change of the bit line BL as a sensing bit. When the sensing bit stored in the sense latch 230 is not a bit generated by using a verify voltage associated with a state that the write bits stored in the data latches 220 indicate, the dump circuit 250 may initialize the sense latch 230 to discard the sensing bit.

When the sensing bit stored in the sense latch 230 is the bit generated by using the verify voltage associated with the state that the write bits stored in the data latches 220 indicate, the dump circuit 250 may dump the sensing bit stored in the sense latch 230 into the pass latch 240. That is, the pass latch 240 may store information indicating whether the memory cell connected with the bit line BL has completed being programmed to the state that the write bits stored in the data latches 220 indicate.

In the following program, when the sensing bit stored in the pass latch 240 indicates a pass of the 1-stage verify, the dump circuit 250 may allow the sense latch 230 to bias the bit line BL with the second voltage, which is applied to a bit line connected with a program-inhibited memory cell, from among the first bias voltages. That is, even though the 1-stage verify of a memory cell is passed after program loops, the data latches 220 may store information of a state programmed to the memory cell.

Figure 15:
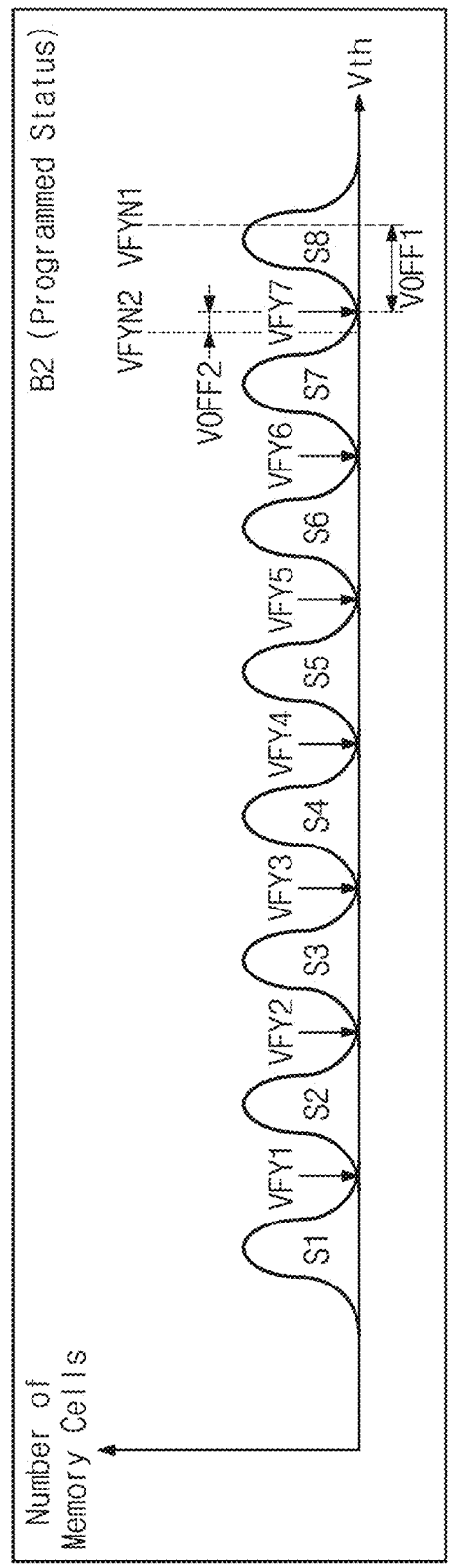
FIG. 15 illustrates an example of a first additional verify voltage and a second additional verify voltage.

FIG. 15 illustrates an example of the first additional verify voltage VFYN1 and a second additional verify voltage VFYN2. Referring to FIGS. 1, 14, and 15, the first additional verify voltage VFYN1 may be determined to be identical to that described with reference to FIG. 7.

The second additional verify voltage VFYN2 may be associated with a state corresponding to the highest threshold voltages, that is, the eighth state S8. In the case where a higher state than the eighth state S8 exists as the number of bits to be written per memory cell increases, the second additional verify voltage VFYN2 may be associated with the highest state.

The second additional verify voltage VFYN2 may be designated as a second offset VOFF2 (e.g., a second offset voltage) associated with the verify voltage VFY7 of the eighth state S8. The second offset VOFF2 may include a sign and a voltage. A level of the second additional verify voltage VFYN2 may be obtained by applying an offset defined by the second offset VOFF2 to a level of the seventh verify voltage VFY7. For example, the second offset VOFF2 may be determined such that the second additional verify voltage VFYN2 is equal to or smaller than the seventh verify voltage VFY7.

After the 1-stage verify is passed, the nonvolatile memory device 100 may count the number of memory cells, which have threshold voltages equal to or smaller than the second additional verify voltage VFYN2, from among memory cells programmed to the eighth state S8. For example, the nonvolatile memory device 100 may perform the 2-stage verify by using the second additional verify voltage VFYN2 and may store second sensing bits in the sense latches 230 of the page buffer block 130.

The page buffer block 130 may initialize the second sensing bits that do not correspond to the eighth state S8, based on the write bits stored in the data latches 220. The page buffer block 130 may output the second sensing bits corresponding to the eighth state S8 to the count block 160. The count block 160 may provide a count value of on-cells to the control logic block 170. When the count value is smaller than a threshold value, the control logic block 170 may determine the 2-stage verify as a pass.

In an exemplary embodiment of the inventive concept, the nonvolatile memory device 100 selects one of the first and second additional verify voltages VFYN1 and VFYN2 to perform the 2-stage verify. When the second additional verify voltage VFYN2 is selected, in the embodiment of FIGS. 8 and 9, the embodiment of FIGS. 10 and 11, and the embodiment of FIGS. 12 and 13, the first additional verify voltage VFYN1 may be replaced with the second additional verify voltage VFYN2.

In another example, the nonvolatile memory device 100 may select all the first and second additional verify voltages VFYN1 and VFYN2 to perform the 2-stage verify. In the embodiment of FIGS. 8 and 9, the embodiment of FIGS. 10 and 11, and the embodiment of FIGS. 12 and 13, the second additional verify voltage VFYN2 may be applied to a selected word line in addition to the first additional verify voltage VFYN1.

A first count value of off-cells corresponding to the first additional verify voltage VFYN1 and a second count value of on-cells corresponding to the second additional verify voltage VFYN2 may be added up. The control logic block 170 may compare the added-up result with the second threshold value TH2 to determine a pass or fail of the 2-stage verify. For example, the control logic block 170 may compare a sum of the first count value and the second count value with the second threshold value TH2.

In an exemplary embodiment of the inventive concept, when a count value that is obtained through the 2-stage verify performed by using the first and second additional verify voltages VFYN1 and VFYN2 is smaller than the second threshold value TH2 and is greater than a fourth threshold value TH4, the nonvolatile memory device 100 selects all the first and second additional verify voltages VFYN1 and VFYN2 to perform the 2-stage verify.

Figure 16:
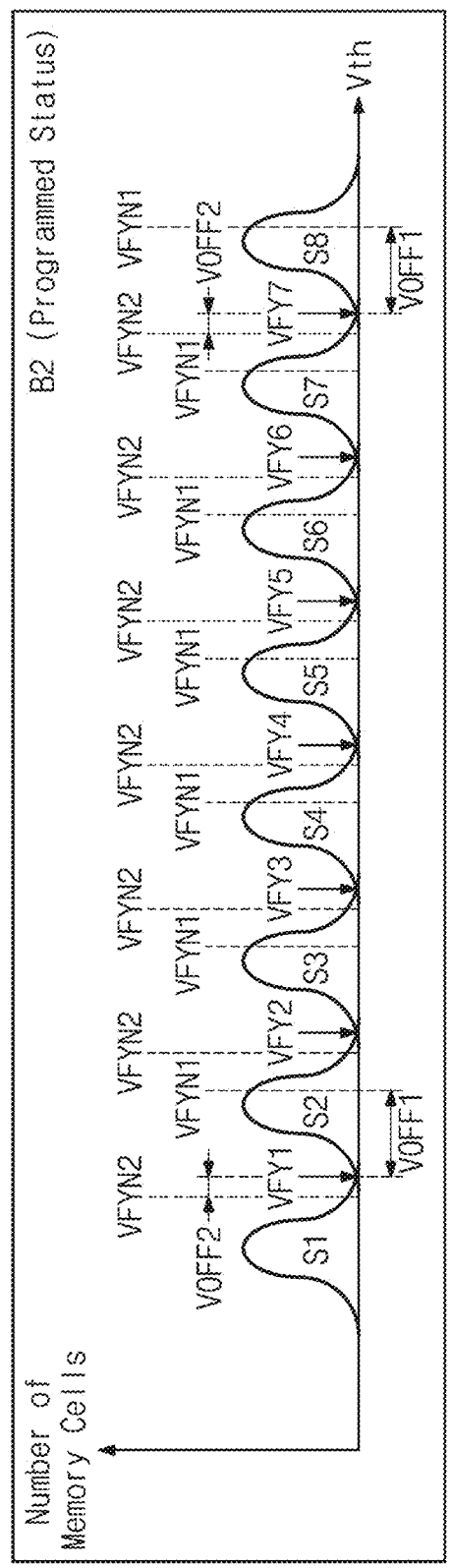
FIG. 16 illustrates an example in which a first additional verify voltage and a second additional verify voltage are used with respect to each of second to eighth states.

FIG. 16 illustrates an example in which the first additional verify voltage VFYN1 and the second additional verify voltage VFYN2 are used with respect to each of the second to eighth states S2 to S8. Referring to FIGS. 1, 14, and 16, the first additional verify voltages VFYN1 may be determined to be greater than a verify voltage of each state. The second additional verify voltage VFYN2 may be determined to be equal to or smaller than the verify voltage of each state.

The first additional verify voltages VFYN1 may be determined by the same offset, that is, the first offset VOFF1 (refer to FIG. 15). The second additional verify voltages VFYN2 may be determined by the same offset, that is, the second offset VOFF2. The nonvolatile memory device 100 may select at least one of the first to eighth states S1 to S8 as a target state(s) and may perform the 2-stage verify.

In an exemplary embodiment of the inventive concept, the nonvolatile memory device 100 selects one of the first and second additional verify voltages VFYN1 and VFYN2 to perform the 2-stage verify. In another example, the nonvolatile memory device 100 may select all the first and second additional verify voltages VFYN1 and VFYN2 to perform the 2-stage verify.

Figure 17:
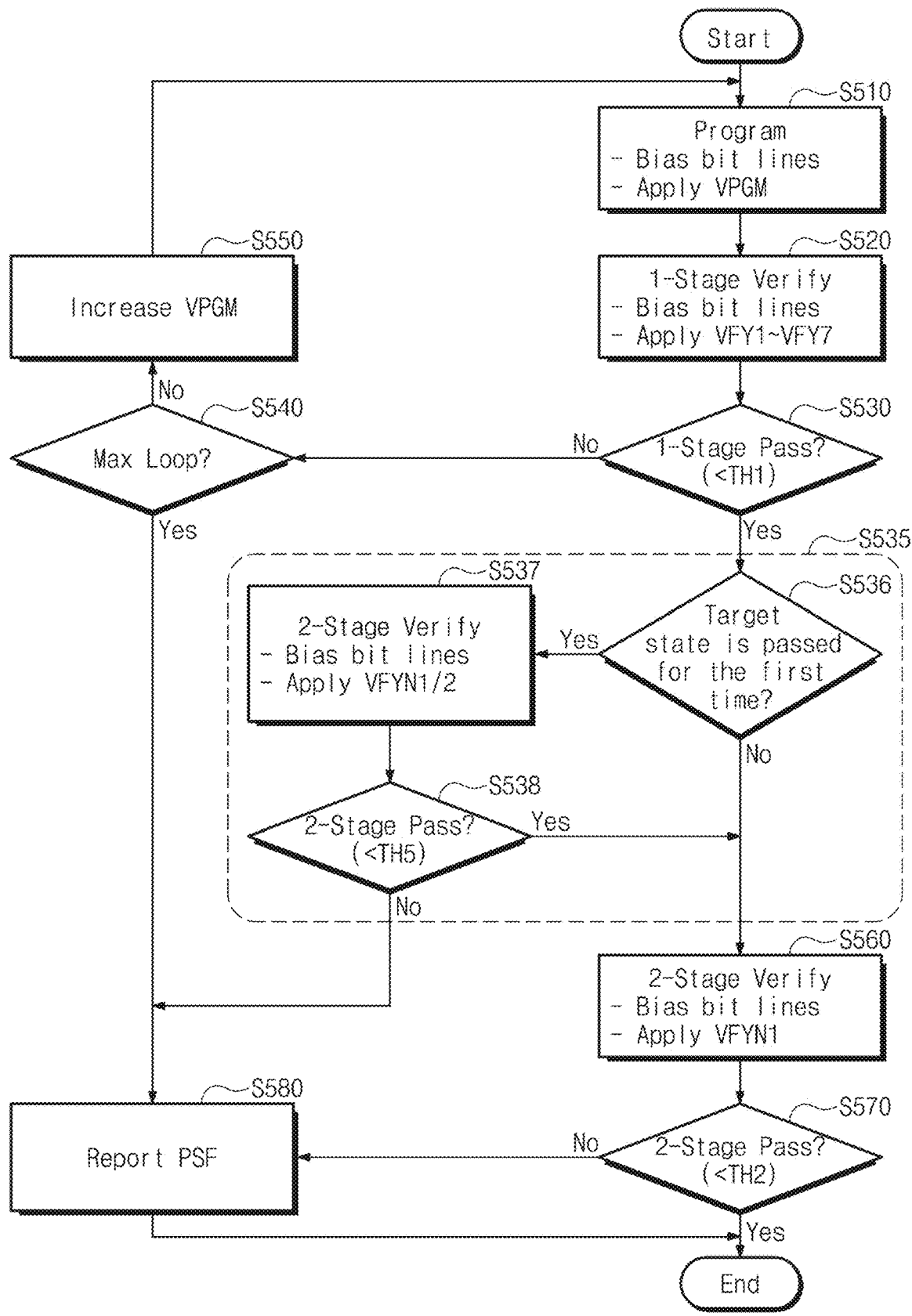
FIG. 17 illustrates an example of a method of performing a program operation by using first to seventh verify voltages, a first additional verify voltage, and a second additional verify voltage of FIG. 16.

FIG. 17 illustrates an example of a method of performing a program operation by using the first to seventh verify voltages VFY1 to VFY7, the first additional verify voltage VFYN1, and the second additional verify voltage VFYN2 of FIG. 16. In an embodiment, an example in which another state is a target state in addition to the eighth state S8 corresponding to the highest threshold voltage is illustrated in FIG. 17.

Referring to FIGS. 1, 16, and 17, operation S510, operation S520, operation S530, operation S540, operation S550, operation S560, operation S570, and operation S580 are performed to be identical to operation S210, operation S220, operation S230, operation S240, operation S250, operation S260, operation S270, and operation S280 of FIG. 8.

Compared to FIG. 8, operation S535 is added between operation S530 and operation S540 for the 2-stage verify of the target state. Operation S535 may include operation S536, operation S537, and operation S538.

In operation S536, the nonvolatile memory device 100 determines whether the 1-stage verify of the target state is first passed. When the 1-stage verify of the target state is not first passed, operation S560 may be performed. When the 1-stage verify of the target state is first passed, operation S537 is performed.

In operation S537, the nonvolatile memory device 100 perform the 2-stage verify by using one or all of the first and second additional verify voltages VFYN1 and VFYN2 of the target state.

In operation S538, the nonvolatile memory device 100 determine whether a pass or fail of the 2-stage verify has occurred. When a count value of the count block 160 is smaller than a fifth threshold value (e.g., TH5), a pass of the 2-stage verify may be determined. When the pass of the 2-stage verify is determined, operation S560 is performed. When a fail of the 2-stage verify is determined, operation S580 is performed.

That is, the nonvolatile memory device 100 does not continue the program operation until the 1-stage verify is passed and may detect the spread of a threshold voltage distribution early. When the spread of a threshold voltage distribution is early detected, the program operation is terminated earlier, and a time that is wasted to perform the program operation may be reduced.

In an exemplary embodiment of the inventive concept, when 2-stage verify is performed on at least one target state, operation S580 is omitted, and thus, the 2-stage verify associated with the eighth state S8 is omitted.

Figure 18:
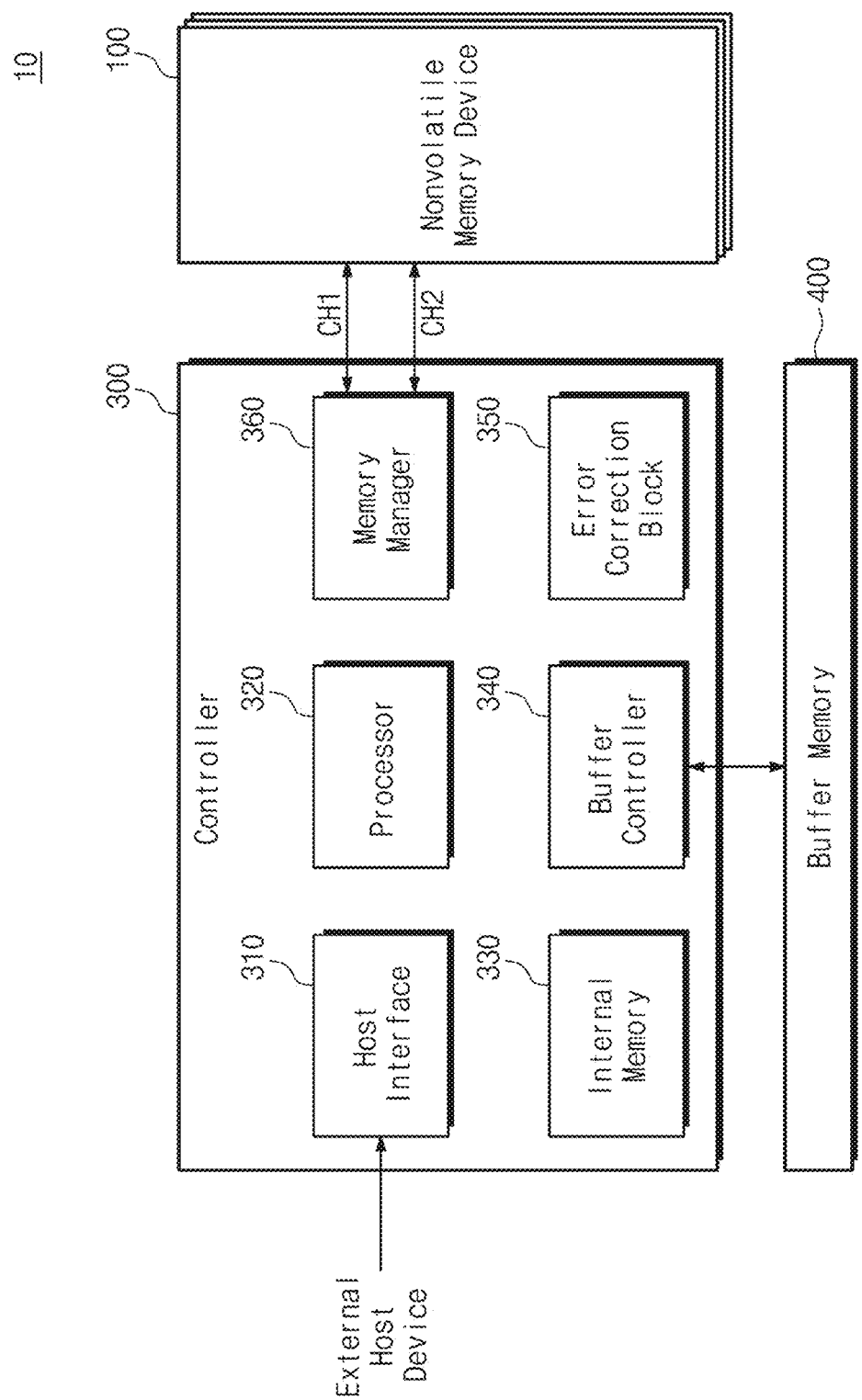
FIG. 18 illustrates a storage device according to an exemplary embodiment of the inventive concept.

FIG. 18 illustrates a storage device 10 according to an exemplary embodiment of the inventive concept. Referring to FIG. 18, the storage device 10 includes the nonvolatile memory devices 100, a controller 300, and a buffer memory 400. The nonvolatile memory devices 100 may perform the 1-stage verify and the 2-stage verify in the program operation as described with reference to FIGS. 1 to 17.

The controller 300 may access the nonvolatile memory devices 100 depending on a request of an external host device. The controller 300 may include a host interface 310 (e.g., an interface circuit), a processor 320, an internal memory 330, a buffer controller 340, an error correction block 350 (e.g., an error correction circuit), and a memory manager 360.

The host interface 310 may store requests and addresses received from the external host device in the internal memory 330. The host interface 310 may store data received from the external host device in the buffer memory 400. The host interface 310 may transmit data stored in the buffer memory 400 to the external host device. The host interface 310 may exchange various signals with the external host device in compliance with a given protocol.

The processor 320 may convert the requests and addresses stored in the internal buffer 330 into commands and addresses appropriate for the nonvolatile memory devices 100. The processor 320 may provide the converted commands and addresses to the memory manager 360. The processor 320 may perform various operations for managing the storage device 10 and may drive firmware.

The internal memory 330 may include at least one of a static random access memory (SRAM), a dynamic random access memory (DRAM), a magnetic RAM (MRAM), a phase-change RAM (PRAM), a resistive RAM (RRAM), a ferroelectric RAM (FeRAM), etc.

The buffer controller 340 may control the buffer memory 400. The error correction block 350 may perform error correction encoding on data to be written in the nonvolatile memory devices 100 and may correct an error by performing error correction decoding on data read from the nonvolatile memory devices 100.

The memory manager 360 may control the nonvolatile memory device 100 through the first channel CH1 and the second channel CH2. The memory manager 360 may transmit commands and addresses to the nonvolatile memory devices 100 through the first channel CH1. The memory manager 360 may exchange data with the nonvolatile memory devices 100 through the first channel CH1. The memory manager 360 may exchange various control signals with the nonvolatile memory devices 100 through the second channel CH2.

The buffer memory 400 may include at least one of a dynamic random access memory (DRAM), a magnetic RAM (MRAM), a phase-change RAM (PRAM), a resistive RAM (RRAM), a ferroelectric RAM (FeRAM), etc.

Figure 19:
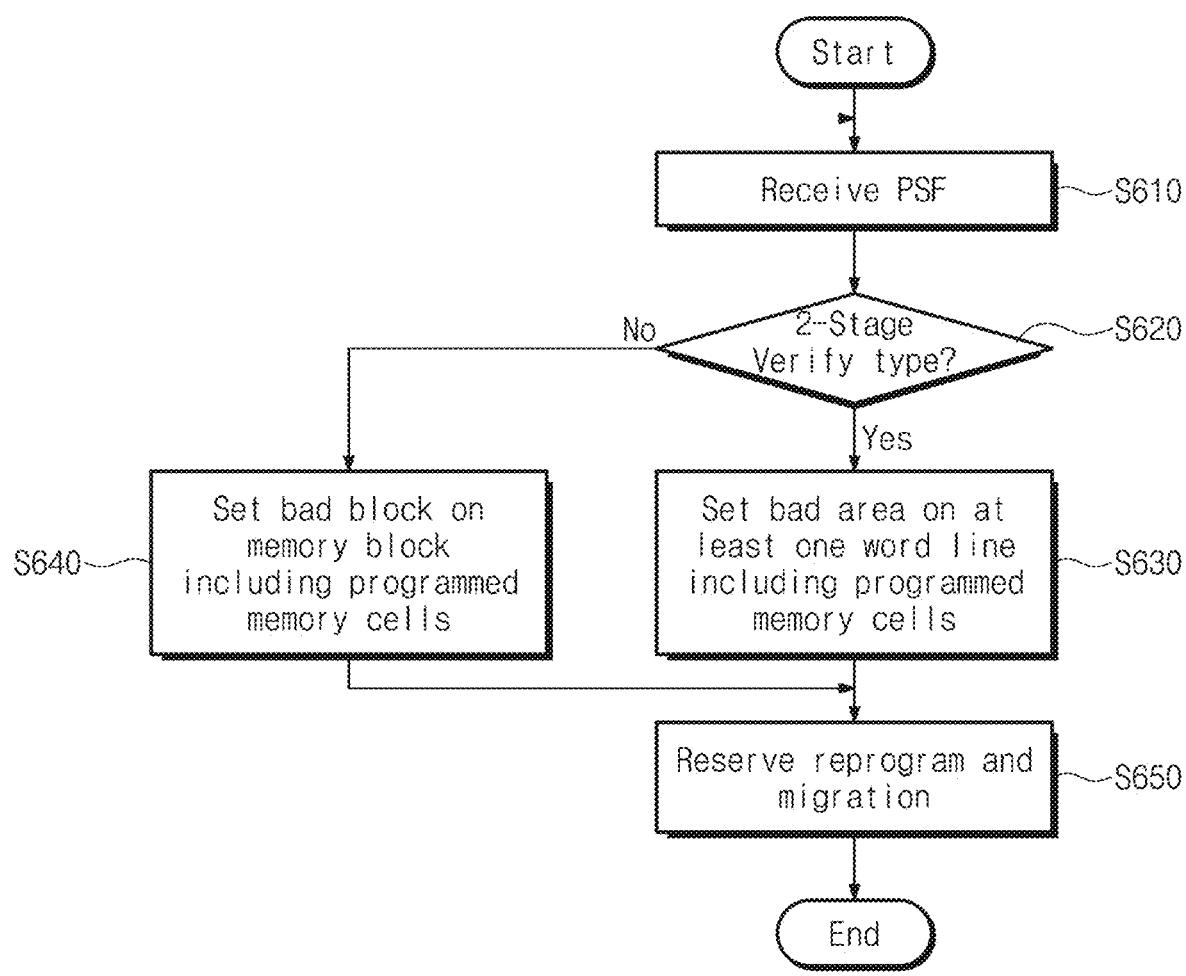
FIG. 19 illustrates an example of an operating method of a storage device of FIG. 18.

FIG. 19 illustrates an operating method of the storage device 10 of FIG. 18 according to an exemplary embodiment of the inventive concept. Referring to FIGS. 18 and 19, in operation S610, the controller 300 receives a signal of the program state fail PSF.

In operation S620, the controller 300 determines whether the signal of the program state fail PSF is of a type of a 2-stage verify fail. When the signal of the program state fail PSF is of the type of the 2-stage verify fail, the controller 300 sets a storage space of at least one word line including memory cells, on which a program operation is performed, to a bad area. For example, the controller 300 may set a storage space of memory cells of a word line at which a fail occurs and memory cells of word lines adjacent to the word line at which the fail occurs, to a bad area. For example, the signal may have a first value to the type of the 2-stage verify fail and a second other value to indicate otherwise.

When the signal of the program state fail PSF is not of the type of the 2-stage verify fail, in operation S640, the controller 300 may set a memory block including the memory cells, on which the program operation is performed, to a bad block and may set the whole storage space of the memory block to a bad area.

The data stored in the bad block or the bad area may be migrated to a different or spare area of memory, in operation S650.

A decrease in capacity of the storage device 10 may be minimized by setting, to a bad area, only a storage area of memory cells of a word line at which the progressive resistance occurs and memory cells of word lines adjacent to the word line when a stage verify fail occurs.

In the above embodiments, components according to the inventive concept are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments of the inventive concept are described by using blocks. The blocks may be implemented with various hardware devices, such as an integrated circuit (IC), an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to at least one embodiment of the inventive concept, an additional verify for detecting an abnormal distribution is performed in a program operation. When the abnormal distribution is detected, a corresponding storage space is set to a bad area. Accordingly, a nonvolatile memory device with improved reliability and a storage device including the nonvolatile memory device are provided.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A nonvolatile memory device comprising:
a memory cell array including a plurality of memory cells; and
a peripheral circuit configured to perform a program operation on memory cells selected from the plurality of memory cells, the peripheral circuit comprising a first verify unit and a second verify unit, the program operation including repeatedly performing a program loop,
wherein the program loop includes:
performing a program by applying a program voltage to the selected memory cells; and
performing, by a control of the first verify unit, a first verify by applying a plurality of verify voltages to the selected memory cells,
wherein the peripheral circuit is further configured to:
complete the program operation in response to a success of the first verify;
perform, by a control of the second verify unit, a second verify by applying an additional verify voltage different from the plurality of verify voltages to the selected memory cells; and
determine the program operation has failed in response to a failure of the second verify,
wherein the additional verify voltage is greater than a highest one of the plurality of verify voltages, and
wherein the peripheral circuit further comprises a count block configured to count a number of turn-on memory cells among the memory cells selected from the plurality of memory cells to determine whether each of the first verify and the second verify fails.

2. The nonvolatile memory device of claim 1, wherein the peripheral circuit is further configured to:
output a signal indicating a program state fail to an external device in response to the failure of the second verify.

3. The nonvolatile memory device of claim 1, wherein peripheral circuit determines the program operation has succeeded when the second verify succeeds.

4. The nonvolatile memory device of claim 1, wherein the additional verify voltage differs with one verify voltage of the plurality of verify voltages by an offset voltage, and wherein, when the one verify voltage changes, the additional verify voltage changes together with the one verify voltage, with the offset voltage being maintained.

5. The nonvolatile memory device of claim 1, wherein the peripheral circuit is further configured to:
perform the program to apply the program voltage to the selected memory cells, before the second verify is performed, in response to a success of the first verify; and
perform the first verify to apply the plurality of verify voltages to the selected memory cells after the second verify is performed.

6. The nonvolatile memory device of claim 5, wherein the peripheral circuit determines the program operation has succeeded in response to a success of the second verify and a success of the first verify.

7. The nonvolatile memory device of claim 5, wherein, in response to that a success of the second verify and a failure of the first verify, the peripheral circuit is further configured to perform the program, perform the second verify, and perform the first verify.

8. The nonvolatile memory device of claim 1, wherein the peripheral circuit is further configured to:
perform the program to apply the program voltage to the selected memory cells, before the second verify is performed, in response to a success of the first verify.

9. A storage device comprising:
a nonvolatile memory device; and
a controller configured to transmit a write command, an address, and data to the nonvolatile memory device,
wherein the nonvolatile memory device comprises:
a memory cell array including a plurality of memory cells;
a peripheral circuit configured to perform a program operation of repeatedly performing a program loop in response to the write command, the peripheral circuit comprising a first verify unit and a second verify unit,
wherein the program loop includes:
performing a program by applying a program voltage to memory cells, which are connected with a word line selected by the address, from among the plurality of memory cells; and
perform, by a control of the first verify unit, a first verify by applying a plurality of verify voltages to the selected memory cells,
wherein the peripheral circuit is further configured to:
complete the program operation in response to a success of the first verify based on the data;
perform, by a control of the second verify unit, a second verify by applying an additional verify voltage different from the plurality of verify voltages to the memory cells connected with the selected word line; and
determine the program operation has failed in response to a failure of the second verify,
wherein the additional verify voltage is greater than a highest one of the plurality of verify voltages, and
wherein the peripheral circuit further comprises a count block configured to count a number of turn-on memory cells among the memory cells selected from the plurality of memory cells to determine whether each of the first verify and the second verify fails.

10. The storage device of claim 9, wherein the nonvolatile memory device is further configured to transmit a program state fail signal indicating the failure of the second verify to the controller in response to that the failure of the second verify, and wherein the controller is further configured to set a storage space of the memory cells connected with the selected word line to a bad area in response to the program state fail signal.

11. The storage device of claim 9, wherein the plurality of memory cells are grouped into two or more memory blocks, wherein each of the two or more memory blocks includes two or more memory cells, wherein the nonvolatile memory device is further configured to transmit a program state fail signal indicating a failure of the first verify to the controller in response to a failure of the first verify while the program loop is repeated, and wherein the controller is further configured to set a storage space of a memory block including the memory cells connected with the selected word line from among the two or more memory blocks to a bad area in response to the program state fail signal.

* * * * *